United States Patent
Dempsey

(10) Patent No.: US 9,065,479 B2
(45) Date of Patent: Jun. 23, 2015

(54) DIGITAL TO ANALOG CONVERTER WITH AN INTRA-STRING SWITCHING NETWORK

(71) Applicant: Analog Devices Technology, Hamilton (BM)

(72) Inventor: Dennis A. Dempsey, Newport (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/214,180

(22) Filed: Mar. 14, 2014

(65) Prior Publication Data

US 2014/0266838 A1    Sep. 18, 2014

Related U.S. Application Data

(60) Provisional application No. 61/793,777, filed on Mar. 15, 2013.

(51) Int. Cl.
| | |
|---|---|
| *H03M 1/66* | (2006.01) |
| *H03M 1/68* | (2006.01) |
| *H03M 1/00* | (2006.01) |
| *H03M 1/06* | (2006.01) |
| *H03M 1/76* | (2006.01) |

(52) U.S. Cl.
CPC ........ *H03M 1/68* (2013.01); *H03M 1/00* (2013.01); *H03M 1/06* (2013.01); *H03M 1/682* (2013.01); *H03M 1/765* (2013.01); *H03M 1/66* (2013.01)

(58) Field of Classification Search
CPC ....... H03M 1/785; H03M 1/808; H03M 1/76; H03M 1/66; H03M 1/46; H03M 1/78; H03M 3/50

USPC .......................................... 341/145, 144, 154
See application file for complete search history.

(56) References Cited

U.S. PATENT DOCUMENTS

| | | |
|---|---|---|
| 4,491,825 A | 1/1985 | Tuthill |
| 4,543,560 A | 9/1985 | Holloway |
| 4,918,448 A | 4/1990 | Hauviller et al. |
| 5,075,677 A | 12/1991 | Meaney et al. |
| 5,495,245 A | 2/1996 | Ashe |
| 5,554,986 A | 9/1996 | Neidorff |
| 5,648,780 A * | 7/1997 | Neidorff ........................ 341/154 |
| 5,703,588 A | 12/1997 | Rivoir et al. |
| 5,764,174 A * | 6/1998 | Dempsey et al. ............. 341/154 |
| 5,969,657 A * | 10/1999 | Dempsey et al. ............. 341/145 |
| 5,999,115 A * | 12/1999 | Connell et al. ................ 341/145 |
| 6,252,534 B1 | 6/2001 | Timko |
| 6,414,616 B1* | 7/2002 | Dempsey ....................... 341/144 |
| 6,567,026 B1 | 5/2003 | Gorman |
| 6,781,536 B1 | 8/2004 | Martins |
| 6,914,547 B1 | 7/2005 | Swaroop et al. |
| 7,136,002 B2 | 11/2006 | Dempsey et al. |

(Continued)

OTHER PUBLICATIONS

Non-Final Office Action in U.S. Appl. No. 13/214,341 mailed Oct. 7, 2014, 11 pages.

(Continued)

*Primary Examiner* — Jean B Jeanglaude

(57) ABSTRACT

In an example, a multistring DAC is described and includes at least two DAC stages. Each DAC stage includes a string of impedance elements and a switching network. In one configuration, the multi-string DAC is configured to use the voltage change at terminals of a first string separately to the voltage drop across a first switching network that couples the first and second strings to provide an analog output in response to a digital input to the DAC.

39 Claims, 24 Drawing Sheets

(56) References Cited

U.S. PATENT DOCUMENTS

| | | |
|---|---|---|
| 7,283,079 B2 | 10/2007 | Jain |
| 7,339,508 B2 | 3/2008 | Cosgrave et al. |
| 7,372,387 B2 | 5/2008 | Li et al. |
| 7,375,669 B2 | 5/2008 | Kim et al. |
| 7,382,302 B2 * | 6/2008 | Muramatsu et al. .......... 341/155 |
| 7,443,326 B2 | 10/2008 | Raphaeli |
| 7,453,385 B2 | 11/2008 | Hino |
| 7,474,245 B1 | 1/2009 | Wang et al. |
| 7,796,060 B2 | 9/2010 | Oberhuber et al. |
| 7,804,432 B2 | 9/2010 | Fakuzawa et al. |
| 7,808,412 B2 | 10/2010 | Fakuzawa et al. |
| 7,924,202 B2 | 4/2011 | Fakuzawa et al. |
| 7,956,786 B2 | 6/2011 | Cosgrave |
| 2008/0100489 A1 * | 5/2008 | Trifonov et al. .............. 341/145 |
| 2014/0132435 A1 | 5/2014 | Dempsey |
| 2014/0167997 A1 | 6/2014 | Dempsey |
| 2014/0285369 A1 | 9/2014 | Dempsey |
| 2014/0313066 A1 | 10/2014 | Dempsey |

OTHER PUBLICATIONS

Non-Final Office Action in U.S. Appl. No. 14/214,405 mailed Oct. 30, 2014, 12 pages.

* cited by examiner

DIGITAL TO ANALOG CONVERTER WITH AN INTRA-STRING SWITCHING NETWORK

PRIORITY DATA

This application is a non-provisional of U.S. Provisional Patent Application Ser. No. 61/793,777, filed Mar. 15, 2013, which is hereby incorporated by reference in its entirety.

FIELD OF THE DISCLOSURE

The present application relates to digital to analog converters (DACs) and particularly to a DAC implemented using multiple switched strings. The present teaching particularly relates to a DAC comprising an intra-string switching network. Such configurations are particularly suited for integrated circuit fabrication using, for example, MOS technology.

BACKGROUND

Digital to Analog Converters or DACs are well known in the art and are used to decode a digital input signal to a corresponding output analog signal. Examples of such DACs are described in co-assigned U.S. Pat. No. 5,969,657, the content of which is incorporated herein by way of reference.

Other known DAC configurations are described in co-assigned U.S. Pat. No. 7,136,002, again incorporated herein by way of reference, which describes a dual string DAC configuration implemented using a high impedance intermediate state.

These types of DAC configurations have found widespread use and application. Despite their advantages there is always a need for improved arrangements.

SUMMARY

There is provided in accordance with one aspect of the present teaching a multi-string digital to analog converter, DAC, architecture which may be implemented with reduced cost, improved precision and improved transient performance.

In one aspect, the present teaching provides a multi-string DAC which is configured to use the voltage change at terminals of a first string to provide least significant bit, LSB, and most significant bit, MSB, transitions. In accordance with this aspect of the present teaching a circuit is provided which reduces the output impedance of such multiple-stage digital to analog converters to reduce thermal noise, settling time, DAC transition glitching as well as circuit area and cost.

In accordance with an aspect of the present teaching it is possible to reduce the size of the switches used which has advantages in reducing settling times, DAC transition glitching as well as circuit area and cost. Reduced MOS switch area is also advantageous in effecting a reduction in device leakage, especially at higher operating temperature, and this is also possible in circuits implemented in accordance with the present teaching.

In contrast with prior art techniques which provided a combination of the loading on the first string and the switch impedance together resulting in tighter design constraints and Ron (the on resistance of the switching network in the DAC) vis-à-vis R2 (the resistance of the elements in the second string) conflicts, a configuration in accordance with the presence teaching reduces the second string DAC impedance and significantly increases the on resistance Ron that may be used. This results in an arrangement with reduced noise, cost, self-impedance, settling time and glitching.

In accordance with the present teaching it is possible to distinguish between contributions provided by the voltage changes at the first string from the voltage drop across the current carrying MSB-LSB DAC switch. As the DAC output can be derived from both the input side from the first string to an intra-string multiplexer as a source of DAC transition and the traditional output side of this multiplexer, there are more options available to provide specific DAC transition states. This also enables a use of a larger value of Ron switch network without negatively impacting the overall DAC transfer function performance. This, in turn, allows for smaller MOS device switches with the resultant improvement in lower capacitance, leakage, glitching and settling times. In contrast to the teaching of prior art configurations, an arrangement in accordance with the present teaching is not limited to Ron being determined by the difference between the resistance between the two overall resistances, R2−R1, where R1 is the resistance of elements in the first string, and R2 is the resistance of the elements in the second string.

Accordingly, a first embodiment of the application provides a DAC as provided in accordance with the independent claims. Advantageous embodiments are provided in the dependent claims.

BRIEF DESCRIPTION OF THE DRAWINGS

The present application will now be described with reference to the accompanying drawings in which.

DETAILED DESCRIPTION OF THE DRAWINGS

The present teaching will now be described with reference to exemplary arrangements implemented in the form of a multi-string digital to analog converter, DAC. Digital to analog converters are used to convert an input digital signal to corresponding analog output. A DAC per the present teaching does not require a buffered architecture. Conventional DACs are implemented using binary transitions but in accordance with the present teaching, there is no limiting requirement for such binary transitions, although the circuits will be described in that context. Therefore where the present disclosure refers to MSB and LSB transitions, which are typically interpreted in the context of a binary state change reflecting specifics of a digital input code, within the context of the present teaching these should be interpreted more generally as state changes which do not necessarily represent a binary transition.

It will be appreciated that a multi-string DAC may also be considered a multi-stage DAC where each stage comprises a string of impedance elements. In such a multi-string converter, a first stage uses a first string for converting a group of higher order bits of an N-bit digital word and a second stage using a second string to decode the remaining, lower order bits. Within the context of the following, which is provided to assist the person of skill in an understanding of features and benefits of an arrangement in accordance with the present teaching, each of the strings will be described with reference to an exemplary implementation using resistors. It will be appreciated that resistors are an example of the type of impedance element that may be used and it is not intended to limit the present teaching to an implementation where resistors are used exclusively as impedance elements. In this regard it will be appreciated that resistors may be a preferred type of impedance element, particularly in scenarios where the voltage across the string is high—such as the string that is coupled to the reference terminals of the converter. In other strings where the voltage is relatively small, other elements such as active MOS devices may also be used. The present teaching should therefore not be construed as being limited to a multi-resistor string DAC.

The reference terminals are typically coupled to the first string and the following example illustrates a specific example of a voltage source. As will be appreciated by those skilled in the art the term voltage source is intended to define and include an active voltage supply, a voltage buffer or a current source which is couple to other circuit elements and configured to provide a target voltage. Within this general definition it will be appreciated that the present teaching should not be limited to any one specific configuration and hence the use of the term reference terminal.

Figure 1A:
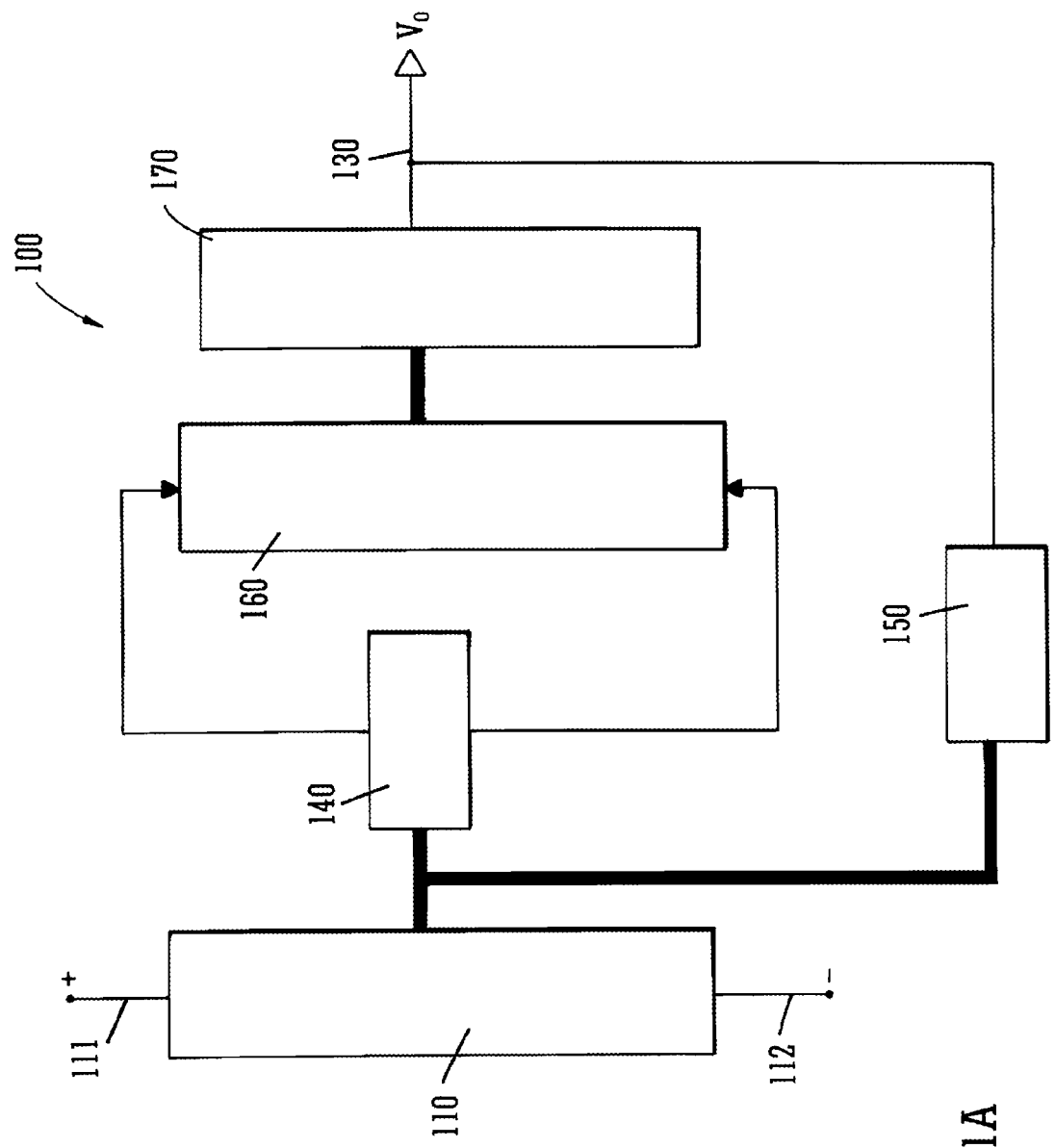
FIG. 1A is a block architecture schematic showing a DAC circuit provided in accordance with the present teaching
Figure 1B:
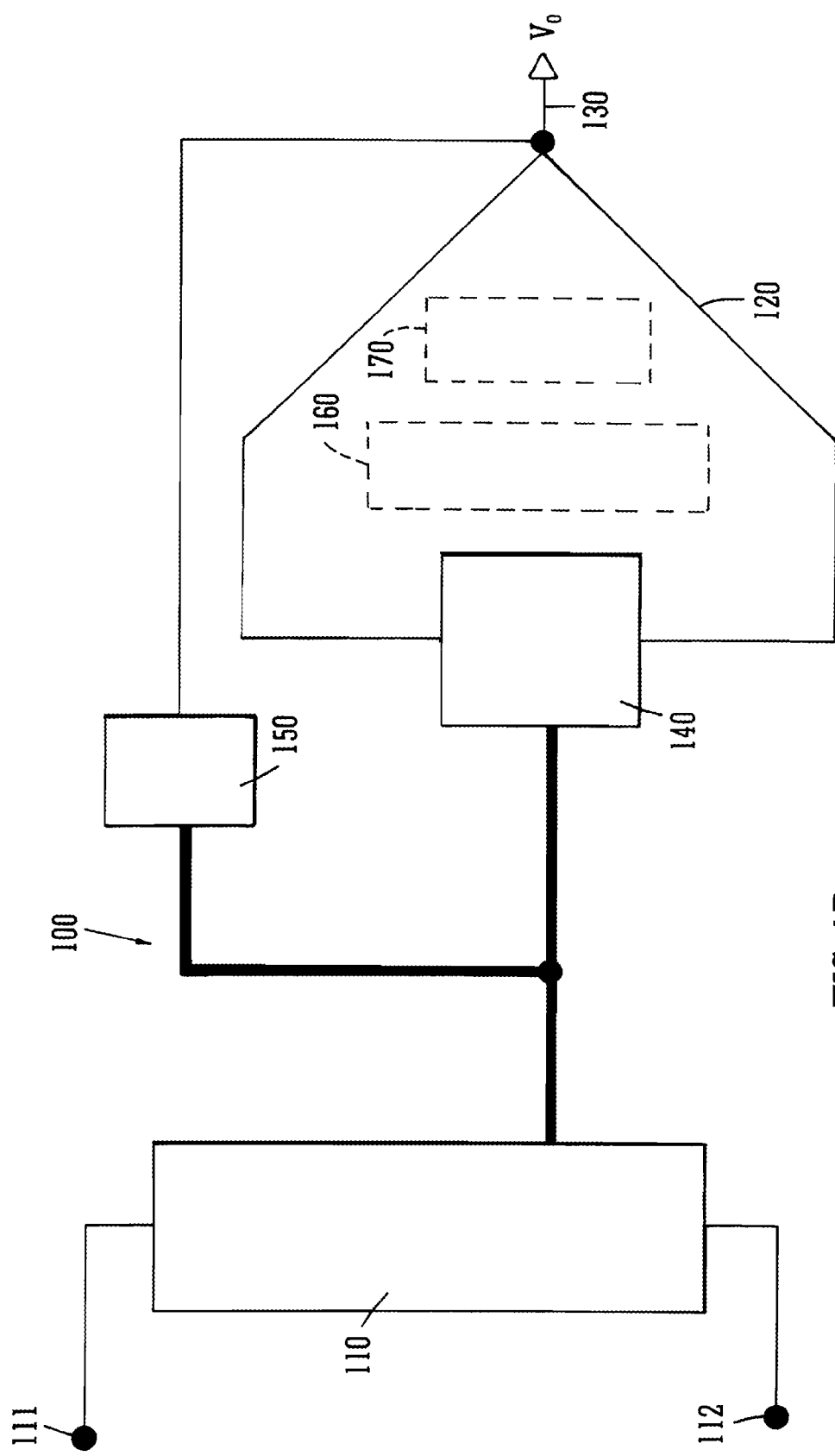
FIG. 1B is a block architecture schematic showing a DAC circuit provided in accordance with the present teaching.

FIGS. 1A and 1B shows an example in block schematic form of a multi-string digital to analog converter, DAC, 100 provided in accordance with the present teaching. The DAC comprises a first DAC string 110 with a plurality of impedance elements (shown in the schematic of FIG. 1C as impedance elements R1). The first string 110 is coupled to reference terminals, or nodes, in this specific example reference terminals provided by a voltage source at first 111 and second 112 reference nodes.

In the schematic of FIG. 1, these reference nodes are illustrated as being a positive and negative voltage reference nodes, but it will be appreciated that different potentials could be provided as required. The first string is configured to convert Most Significant Bits (MSBs) of a digital input signal and can therefore be considered as a MSB DAC string. As will be appreciated from the following, in certain configurations selected LSB codes can also be provided by selective and judicious switching of $1^{st}$ string impedance elements, and the present teaching is not to be construed as being limited to only providing MSB switching from the first string. It will be therefore be understood from the following that, in accordance with the present teaching, judicious switching of at least one of the impedance elements of this first string may be used to provide an LSB transition at the output of the DAC. In this way the first stage should not be considered as exclusively providing a conversion of MSBs of the digital input word.

Figure 1C:
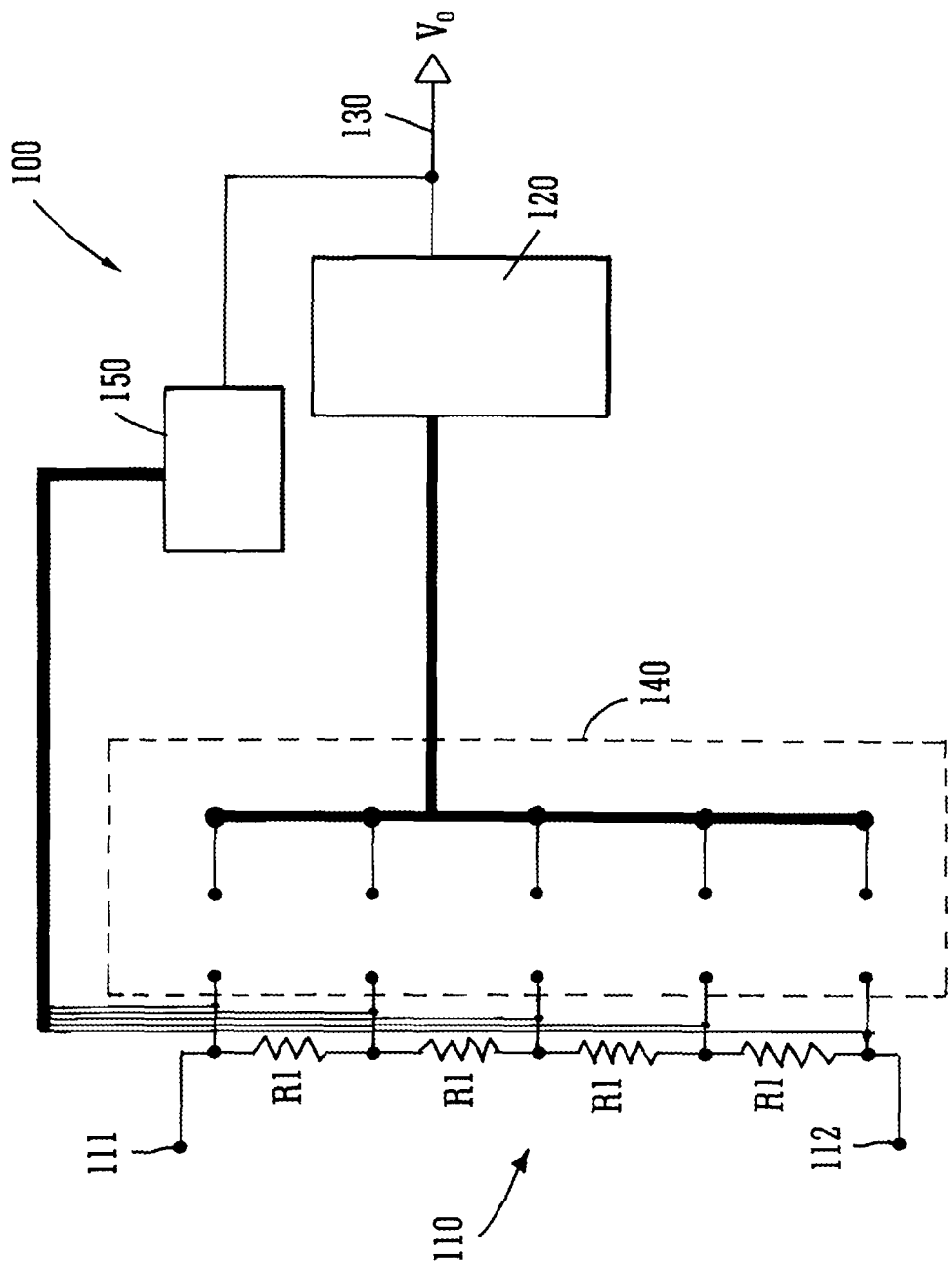
FIG. 1C is a block architecture schematic showing details of the circuit of FIG. 1B.
Figure 1D:
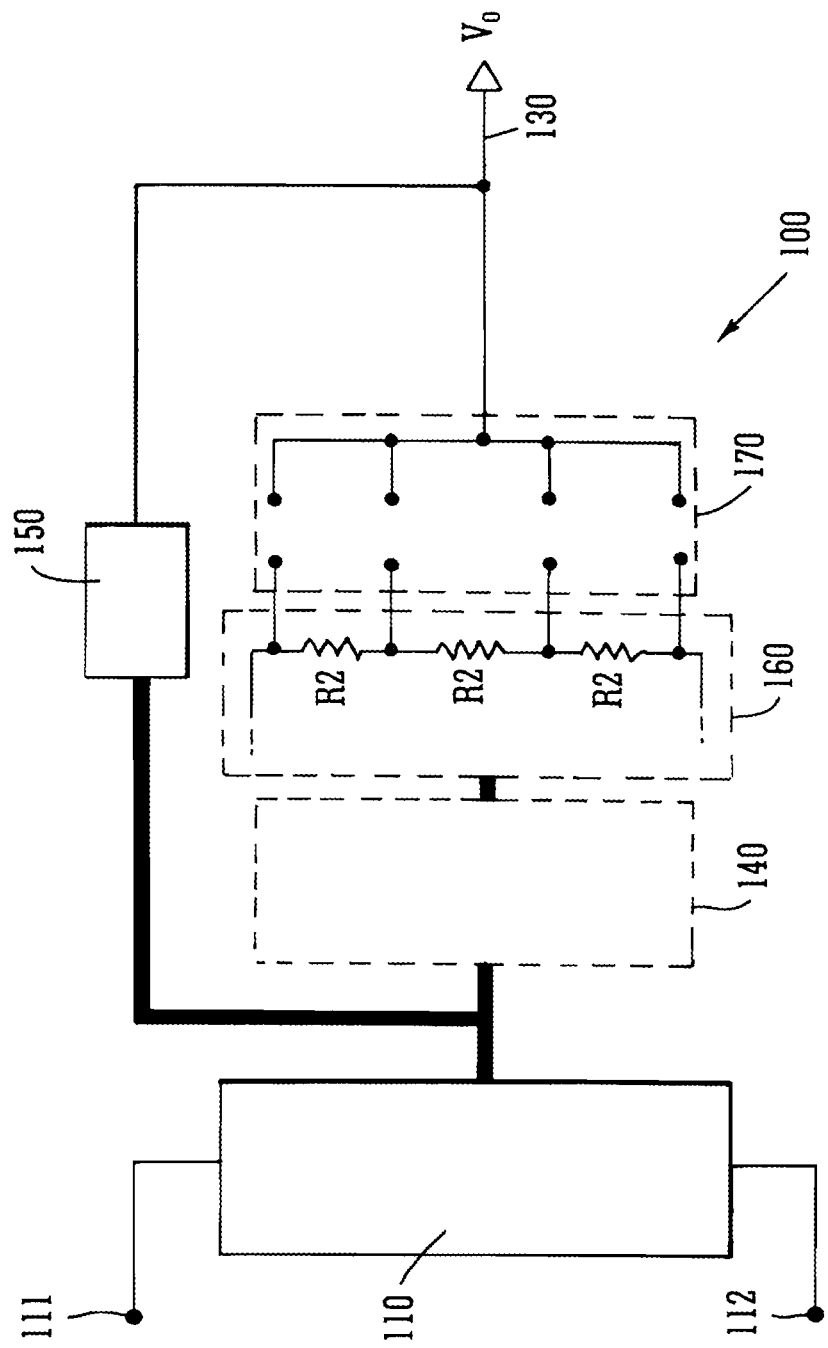
FIG. 1D is a block architecture schematic showing details of the circuit of FIG. 1B.

The DAC 100 also comprises a second set of circuit components which are configured to convert Least Significant Bits (LSBs) of a digital input signal and can therefore be considered as a LSB DAC block 120. This LSB DAC block 120 comprises—as shown in FIG. 1D-a second string 160 of the DAC, the second string 160 comprising a plurality of impedance elements R2. It will be appreciated that the number of individual impedance elements will vary in the second string dependent on the overall DAC configuration and this exemplary arrangement of three individual resistors should be considered as purely exemplary of the number of impedance elements that may form the actual circuit. This LSB DAC block 120 is coupled to an output node 130 of the DAC. As mentioned above, the second block is configured to convert Least Significant Bits (LSBs) of a digital input signal and can therefore be considered as a LSB DAC string, but again, as will be appreciated from the following, the present teaching is not to be construed as being limited to only providing LSB switching from this second string.

The DAC 100 further comprises a first switching network 140 adapted to couple a voltage produced across a selected one or at least one of the impedance elements in the first string 110 across the second string 160 in response to a digital input signal. The digital signal comprises a digital bit stream and the impedance elements in the second string are configured to produce voltages in response to current passing from the first string through the first switching network to the second string to produce a corresponding analog signal to said digital input signal to the output node 130. It will be appreciated from the following that selected switches of this first switching network 140 may be considered as shared, intra-string, elements with the second string 160. It will be understood that the term "intra-string" reflects the fact that these switches form part of both the first switching network and the second string and are within or inside both blocks.

The DAC of FIG. 1 also provides a second switching network 150 comprising non-current carrying switches which are configured to provide at least one least significant bit, LSB, transition at the output node in response to a digital input signal. It will be appreciated that when referring to these switches as non-current carrying switches that:

1) this is a reference to the use of the switches in a DC sense, as they pass current during transitions or changes and;

2) there may be some low level leakage, but this leakage is low enough to make DAC substantially insensitive to the Ron of these switches.

As shown in FIG. 1D, the second string 160 of impedance elements is coupled to a third switching network 170 of the DAC 100. The third switching network 170 allows for selected ones of the second string 160 to be coupled to the output 130.

The second switching network 150 may be used in combination with the third switching network 170 to sense either side of the first switching network 140, i.e. that side proximal to the first string 110 or that side proximal to the second string 160. This sensing can be effected during states when the $2^{nd}$ string 160 is coupled in parallel with a selected impedance element of the first string 110 or indeed during states when the $2^{nd}$ string is not coupled.

It will be appreciated therefore that terminals of the first string 110 are coupled to two blocks, the first block 140 being an intra-string multiplexer between each of the first and second DAC strings and a second block 150 being a sensing network that directly couples the first DAC string terminal voltages to the output 130. Each of the first 140 and second 150 blocks comprises switches and as such may be considered in block format as switching networks. In the schematic of FIG. 1—and similarly FIGS. 4 and 6—the coupling of the first string to the second block 150 is shown by way of a single line. It will be appreciated that this is for ease of presentation only and that it is not intended to convey the impression that all of the resistors are commonly coupled to the second block 150. Those of ordinary skill will appreciate that each of the resistors could be individually coupled by means of judicious switching to the block 150.

The first switching network, or intra-string multiplexer, comprises switches that form part of the first and second stage architectures. In the schematics of FIGS. 1C and 1D the first block 140 is shown in dashed outline as it comprises switches that could traditionally be considered as forming part of the first or second DAC stages respectively. In the context of the present teaching, this may be considered a shared multiplexer. In this way certain selected switches of the first switching network have a dual operation or purpose in that they are shared by the MSB DAC string and LSB DAC string portions of the DAC 100. It will be appreciated therefore that these switches form part of both stages and can be considered therefore an intra-string multiplexer. Individual ones of the shared switches can be configured to selectively couple impedance elements of the first string to the second string or provide at least one LSB transition directly at the output node 130.

By selectively switching switches of the DAC 100 it is possible to couple terminals from the first or MSB DAC string 110 via non-current carrying switches directly to the output node 130 of the DAC 100. In this way it is possible to provide an LSB transition at the output node separately to any voltage drop across the impedance elements in second resistor string. This can also be done in situations when the second or LSB DAC string 160 is enabled. It will be appreciated that the DAC current, $I_{DAC}$, is substantially code independent.

As was discussed above and as shown in FIG. 1D, the second or LSB DAC block 120 also comprises a third switching network 170 of the overall DAC architecture that comprises switches coupling terminals of the second string 160 directly to the output node 130. These switches are preferably provided as substantially non-current carrying switches or in certain configurations may be coupled to a load to effectively provide a current carrying switch. In either scenario, the second or LSB DAC block 120 is coupled to the output node 130.

In a first mode of operation the first switching network 140 is responsive to the most significant bits, MSBs, of said digital input signal coupled to said first string and the least significant bits, LSBs, of said digital input signal are coupled with the second resistor string. In another mode the first switching network is responsive to the most significant bits, MSBs, of said digital input signal coupled to said first string and is further responsive to least significant bits, LSBs, provided at, or near, transition states of the first string. It will be appreciated that the term transition states refers to those scenarios where a DAC code requires a change of the coupling of impedance elements in the second—or sequential—impedance strings from an identified impedance element in a first string of the DAC to a second neighboring impedance element in that first DAC string. This will appreciated as being different to a conventional migration up and down an impedance string.

Figure 2:
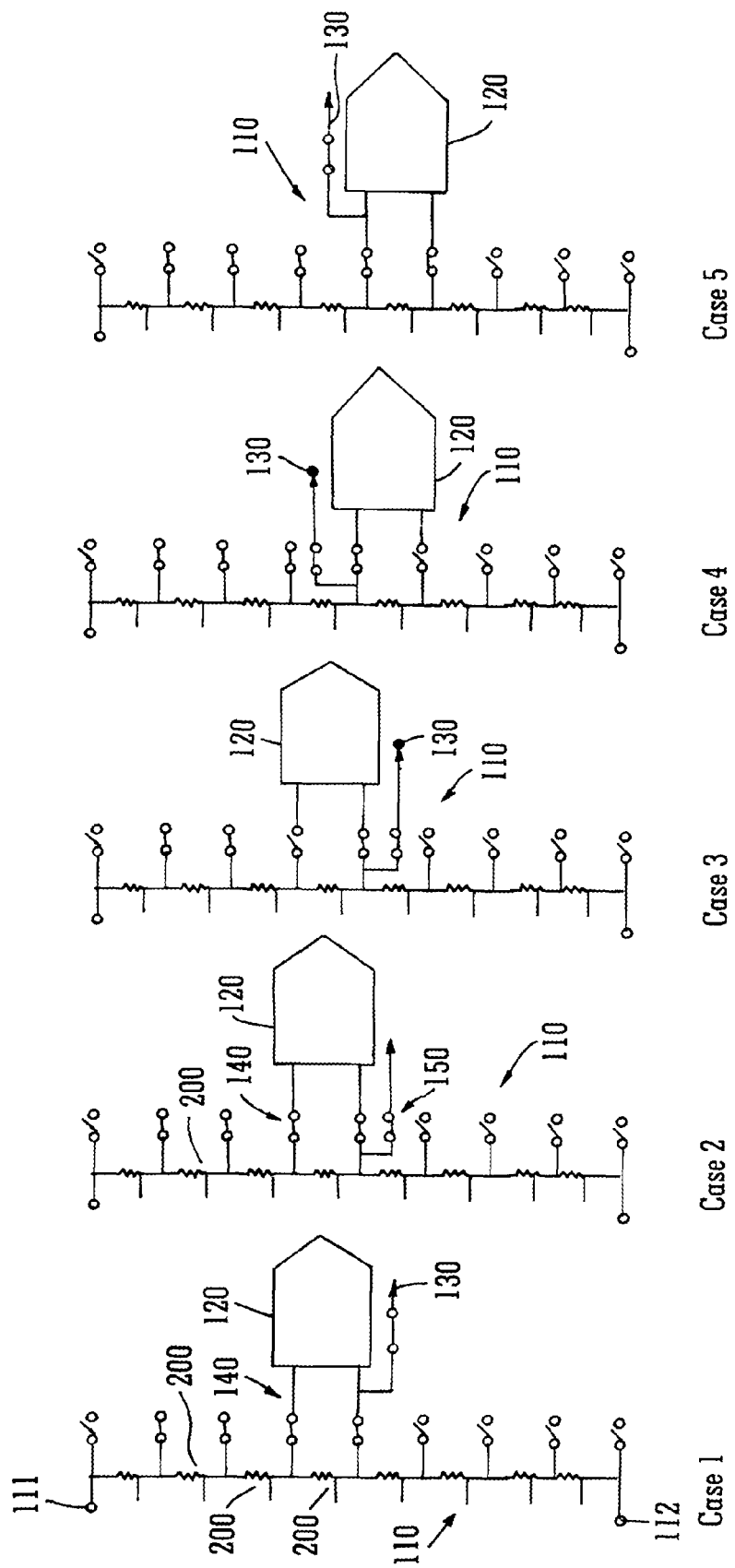
FIG. 2 is a block architecture schematic showing exemplary use cases provided in accordance with the present teaching.

By providing a configuration such as heretofore described it is possible to provide a plurality of LSB transitions at the output of the DAC, dependent on the switching arrangement chosen across an impedance element of the first string. FIG. 2 shows a number of examples in a high level architecture with the same reference numerals used for components already described with reference to FIG. 1.

As shown in FIG. 2, with the second or LSB DAC 120 string shown in block form, a first MSB DAC string 110 comprises a plurality of impedance elements 111, shown here as individual resistors 200. The string is arranged to allow for selective switching of individual ones of the resistors 200. In accordance with techniques that will be appreciated by those skilled in the art, by judiciously selecting which one of the resistors is switched, it is possible to vary the analog output signal provided at the output of the DAC.

In the scenario of Case 1, shown in FIG. 2, the second string 160 of the block 120 is configured to provide a loading effect across the first switching network 140 and at least one resistor 200 of the first string 110. This provides a first LSB transition at the output 130. In another configuration, shown as Case 5 in FIG. 2, by varying the switching arrangement a second LSB transition can be provided. In this way it will be appreciated that the DAC is configured such that a switching, using the first switching network, of the loading effect provided by the second string defines first and second LSB transitions. In this way it is possible to integrate a LSB DAC loading effect so that the sub-DAC loading change can effect multiple LSB steps at the LSB DAC reference terminal which are integrated into the DAC transfer function, rather than an error.

In another configuration shown in Cases 2 and 4, the second string and first switching network are configured to provide a loading effect on the first string, this loading effect being sensed using the second switching network 150 and defining a first and second LSB transition at the output node 130. In this way dependent on the switching configuration chosen a switching of the loading effect provided by the second string, is sensed at a first resistor string terminal of the first switching network and defines a first and second LSB transition at the output node 130.

It will be appreciated from an examination of the various state changes shown in FIG. 2 that a single switch may be used to provide a switching for neighbouring impedance elements in the first string so as to provide a multiple change in LSB at the output dependent on which resistor in the first string the switch is coupled to.

In a further switching configuration shown in Case 3, a switching of the first switching network is configured to provide an unloaded high impedance state generated when a current path between a Least Significant Bit (LSB) impedance element associated with said second string 120, and a Most Significant Bit (MSB) impedance element of said DAC associated with said first string 110, is removed. In this arrangement the voltage of the first string 110 is sensed using the second switching network 150 to provide an LSB transition at the output. It will be appreciated whilst one open switch is shown in the example of Case 3, provision of either or both switches of first switching network in an open state causes the load effect to be substantially de-coupled from the first string.

It will be appreciated that in the examples heretofore described, the first switching network is responsive to the most significant bits (MSBs) of said digital input signal coupled to said first string 110, and the least significant bits (LSBs) of said digital signal are coupled with said second string 120, which includes a plurality of impedance elements, typically resistors. The first switching network is also responsive to transitions between most significant bits (MSBs) of said digital input signal coupled to said first string. In the examples of FIG. 2, a node between neighboring impedance elements 200 of the first string 110 may be coupled to said output.

Using varying switching configurations such as described with reference to FIG. 2 allows multiple state transitions to be provided with each sharing a common feature that the loading effect in the MSB DAC string is now used separately to contributions provided by the LSB DAC string. These transitions may be summarised as follows:

Step 1: voltage on output of $1^{st}$ selected switch in $1^{st}$ switch network 140;

Step 2: voltage on i/p side of selected switch in $1^{st}$ switch network 140, before LSB change-over in LSB DAC string;

Step 3: voltage on i/p side of selected switch in $1^{st}$ switch network 140 with LSB DAC string provided in a high impedance state;

Step 4: voltage on i/p side of selected switch in $1^{st}$ switch network 140 after LSB change-over in LSB DAC string;

Step 5: voltage on output of $2^{nd}$ selected switch in $1^{st}$ switch network 140.

To further optimise this arrangement the switches of the switching network associated with said first string may be sized such that the two states on either side of the unloaded state correspond to an LSB step at the output node.

It will be appreciated that the DAC does not have to be configured to provide all five state transitions and could be configured to omit the high impedance example of Step 3. In this way the DAC may provide four state LSB transitions at the output node, a first state provided by the voltage at an output of the first switching network (Case 1), a second state provided by the voltage on an input side of the first switching network before a LSB transition provided by the second resistor string (Case 2), a third state provided on an input side of the first switching network after a LSB transition provided by the second string (Case 4) and a fourth state provided on an output of the second switching network (Case 5).

In this 4 state implementation, the number of n2 bit LSB DAC resistors required in the second string to provide N2 states (where $N2=2^{n2}$) can be reduced from prior art implementations to a value $2^{n2}-3$. It will be appreciated that similarly to that described in co-assigned U.S. Pat. No. 5,969,657, the Idac is substantially code independent. Furthermore the ON switch resistance of the first switching network, Ron, may be increased to have a comparable value with each of the resistances R2 and R1 of the first and second strings. By having R2=R1=Ron it is possible to provide matched devices and resistors in the first and second string can be used as dummies for each other. By reducing the overall resistance of the second string it is possible to implement this in a lower area implementation having associated benefits of self-capacitance, cost, reducing glitching, improved settling etc. A benefit of the larger Ron is that smaller switches may be used which again is useful, as will be appreciated by those of ordinary skill in the art.

Figure 3:
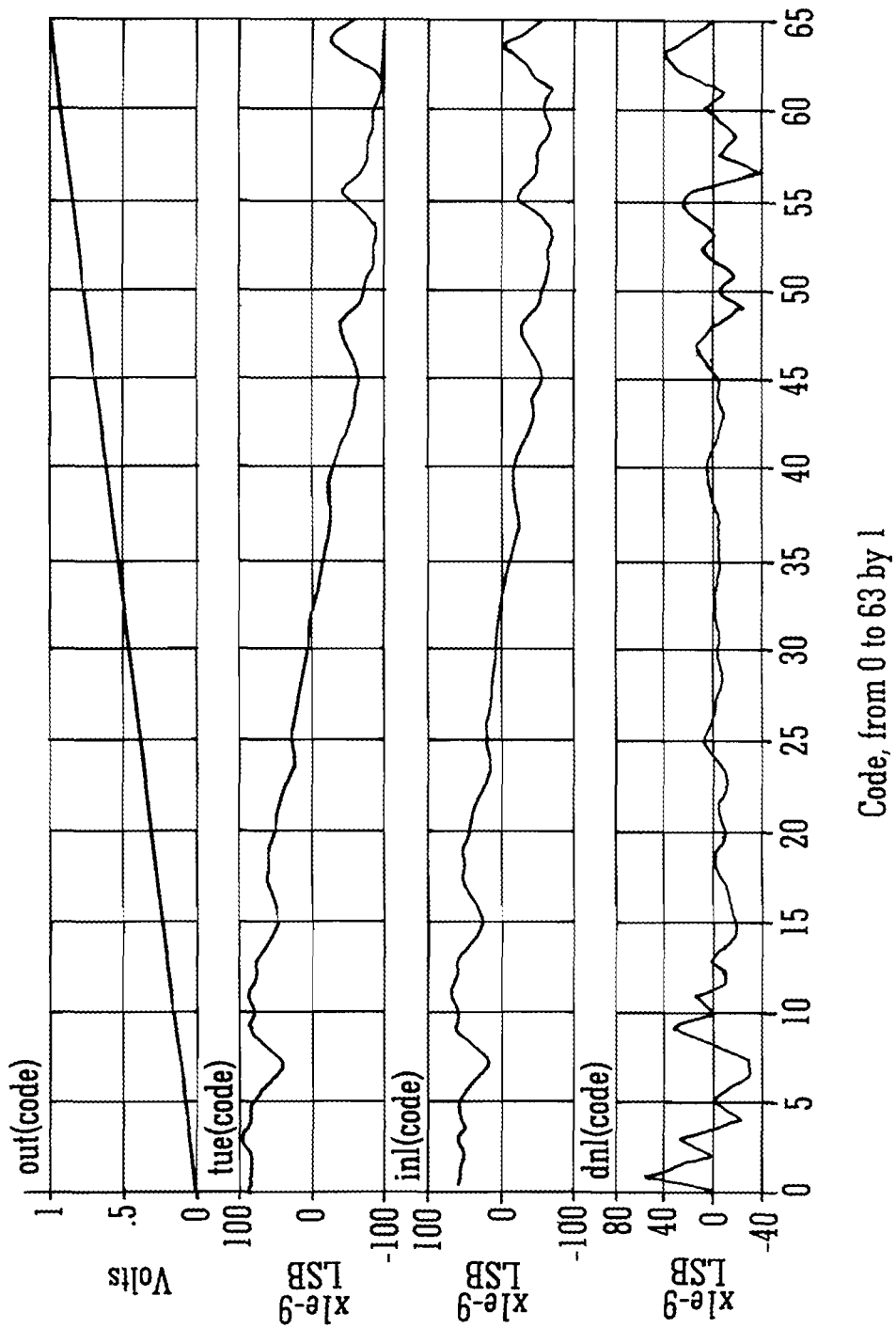
FIG. 3 shows simulation results of an ideal circuit implemented in accordance with the present teaching.

FIG. 3 shows simulation results of an exemplary circuit implementing such a 4 state transition. It will be seen that the total unadjusted error (TUE), differential non-linearity (DNL) and integrated non-linearity (INL) responses are very good in this ideal simulation which, as will be appreciated, is limited by simulation tolerance.

As was discussed above, an additional state transition may be provided by configuring a high impedance at a terminal of the second string such that a fifth state LSB transition may be provided at the output node by sensing the voltage at an input side of the first switching network during this high impedance configuration (Case 3). This high impedance state can be provided in a number of different ways. For example in a first implementation both terminals of the $2^{nd}$ DAC string are disconnected in an unloaded state. In this way no load is presented by the LSB DAC in the unloaded state and the MSB to LSB DAC current path is substantially open-circuited. The LSB DAC reference terminal(s) in this state can go to a high impedance state. The unloaded state may be considered a DC or static state wherein the LSB DAC substantially does not load the MSB DAC.

In another configuration only one of the LSB reference terminals is disconnected from the MSB terminal and while a current path may exist between the MSB DAC and the LSB DAC, the LSB DAC presents substantially no DC load to the MSB DAC such that the voltage of the LSB DAC and output node 130 is driven by the MSB DAC.

By providing a fifth state through a judicious switching arrangement it is possible to reduce the number of resistors in the second string again. In this five state transition in order to provide N2 states the second string comprises $2^{n2}-4$ impedance elements.

In such five state configuration while the ideal ON switch resistance Ron is still determined by Ron=R2. Similarly to that described before, the first switching network has an on switch resistance Ron, the first string comprises impedance elements have a resistance R1 and the second string comprises impedance elements having a resistance R2. Differing from the first four state configuration which was described above, in this arrangement, the relative resistances of the first and second strings can be determined from:

$$R2 = \frac{1}{k} * \frac{2^{n2}-k}{2^{n2}-2} * R1$$

Where:
k=LSB loading effect target with range $0<k<2^{n2}$, n2 is the binary resolution of the $2^{nd}$ impedance string, and N2 (the number of states) with $N2=2^{n2}$.

In the scenario where n2 tends to infinity and/or if k=2, the above equation above will reduce to R2=R1/k. In this way it will be appreciated that R2 will tend to be lower than on previous multi-string DAC architectures.

In the scenario where k=2, i.e. a 2 LSB step which is ideal for a mid-point transitions, the first string is coupled to a voltage source at reference terminals of the first string such that an ideal solution determined from a mid-point of the first string and a mid-point of the DAC transfer function, R2=½ R1.

However at reference voltages with k=1 being the target, Ron, $R2=(2^{n2}-1)/(2^{n2}-2)*R1$ e.g. 7/6 for 3 bit LSB DAC. While this configuration shows that R2 can be scaled to be lower than R1 (R2<R1) and provides for higher Ron values than prior art implementations, such a configuration may suffer as the solution for R2, Ron verses R1 is signal dependent and ideally R2/Ron should vary verses the MSB code being processed. It will be appreciated however that the R2 reduction achievable may be more significant if the LSB DAC ($2^{nd}$ string) has a higher resolution, for example a five or six bit resolution.

While the DAC presented may have non-ideal linearity behavior the other described benefits may suffice to meet the requirements of the intended application. Additional resolution may also be added to reduce the LSB voltage and therefore reduce the error contribution as a portion of fullscale as it is one of the advantages of multi-string DAC architectures that higher resolution is achievable with fewer components than single string based converters.

Figure 4:
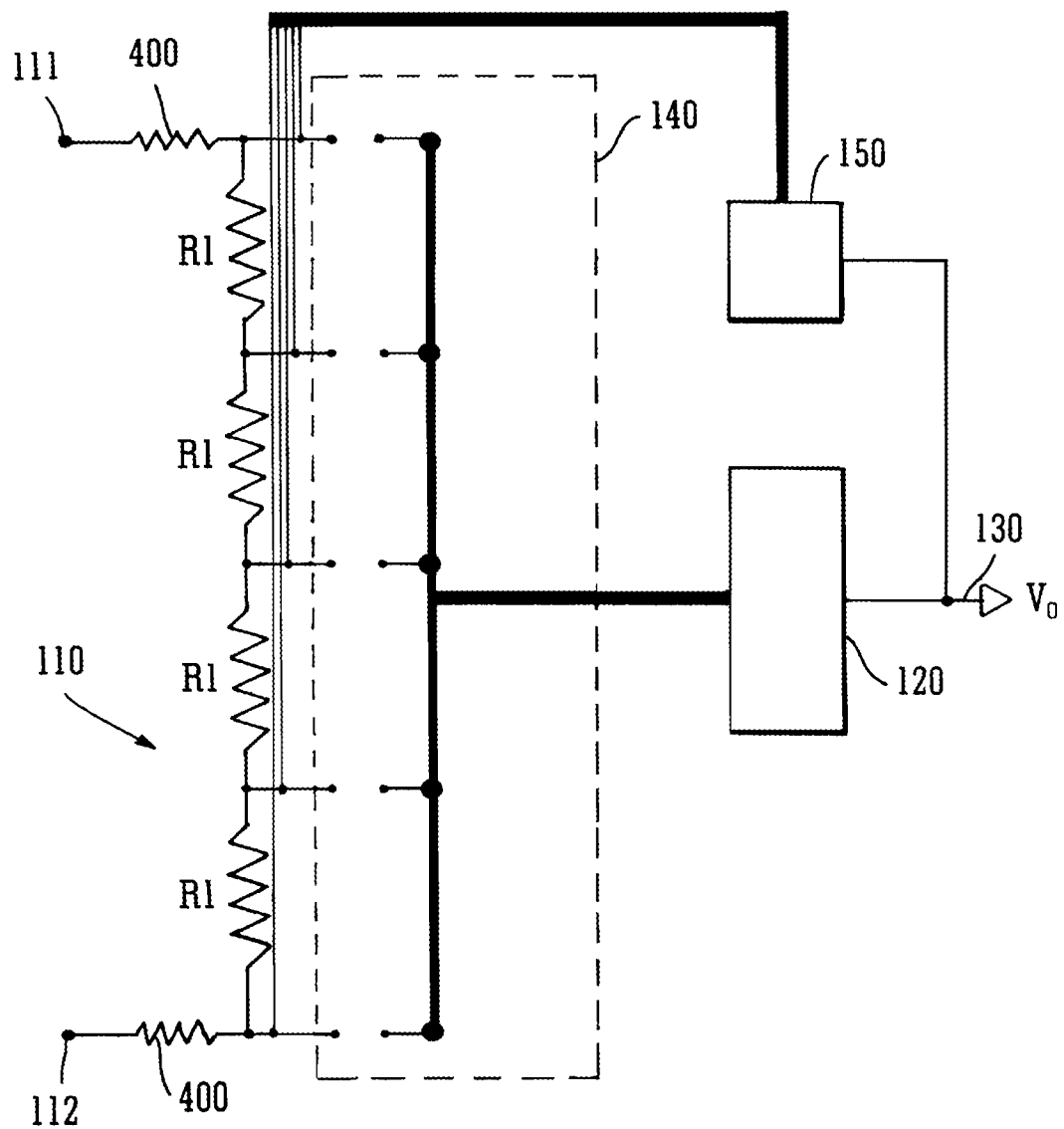
FIG. 4 is a block architecture schematic showing details of a modified circuit in accordance with the present teaching.

However, and as explained above, the linearity 'step' design is code dependent due to dependence on the source impedance of the DAC reference terminals and is preferable optimized at mid-string, mid-impedance condition. The addition of source impedance between the reference voltage source and the reference terminal of the DAC can thus modify and reduce the nonlinearity in the DAC. In accordance with such an understanding, in order to address potential issues towards the ends of the first resistors string, the present teaching may provide a source impedance at at least one of the reference terminals that is scaled relative to R1. Such an arrangement is shown in FIG. 4 whereby first and second source impedances 400 are provided at each of the two reference terminals 111, 112. Dependent on the location of this source impedance, i.e. whether it is placed at the first or second—typically positive or negative respectively—or both ends of the string reference terminals 111, 112 it is possible to reduce or scales an error at one or both of the positive and negative fullscale ends of the DAC transfer function. It will be understood that the value of this source impedance may be selected dependent on the values of the impedances in the first string. It will also be understood that this can be varied using control loops or circuits and/or active injection of additional currents. If provided such control circuits can be coupled to switches of the DAC to provide code dependent compensation for, or control of, variances in the response of those switches.

As the source impedance 400 may be varied relative to the impedances of this first string (and a substantially linear relationship between the two exits) the effect of the non-linearity may be modified. This resistance could be changed to vary the output range. This could be done by a tunable resistance or by, for example, incorporating a resistor DAC function. In either case, it will be appreciated that by increasing the reference source impedance 400 relative to the impedances of the first string it is possible to reduce the DAC non-linearity and in certain configurations this can be usefully employed to tune or otherwise modify the DAC range.

It will be appreciated that in the example of FIG. 4, a source impedance 400 is provided at both the upper and lower ends of the MSB DAC string 110 and can be used to reduce/scale error at both positive and negative fullscale ends of the DAC transfer function. This is a specific example and it will be appreciated that it is not necessary to provide such a source impedance at both ends.

Figure 5:
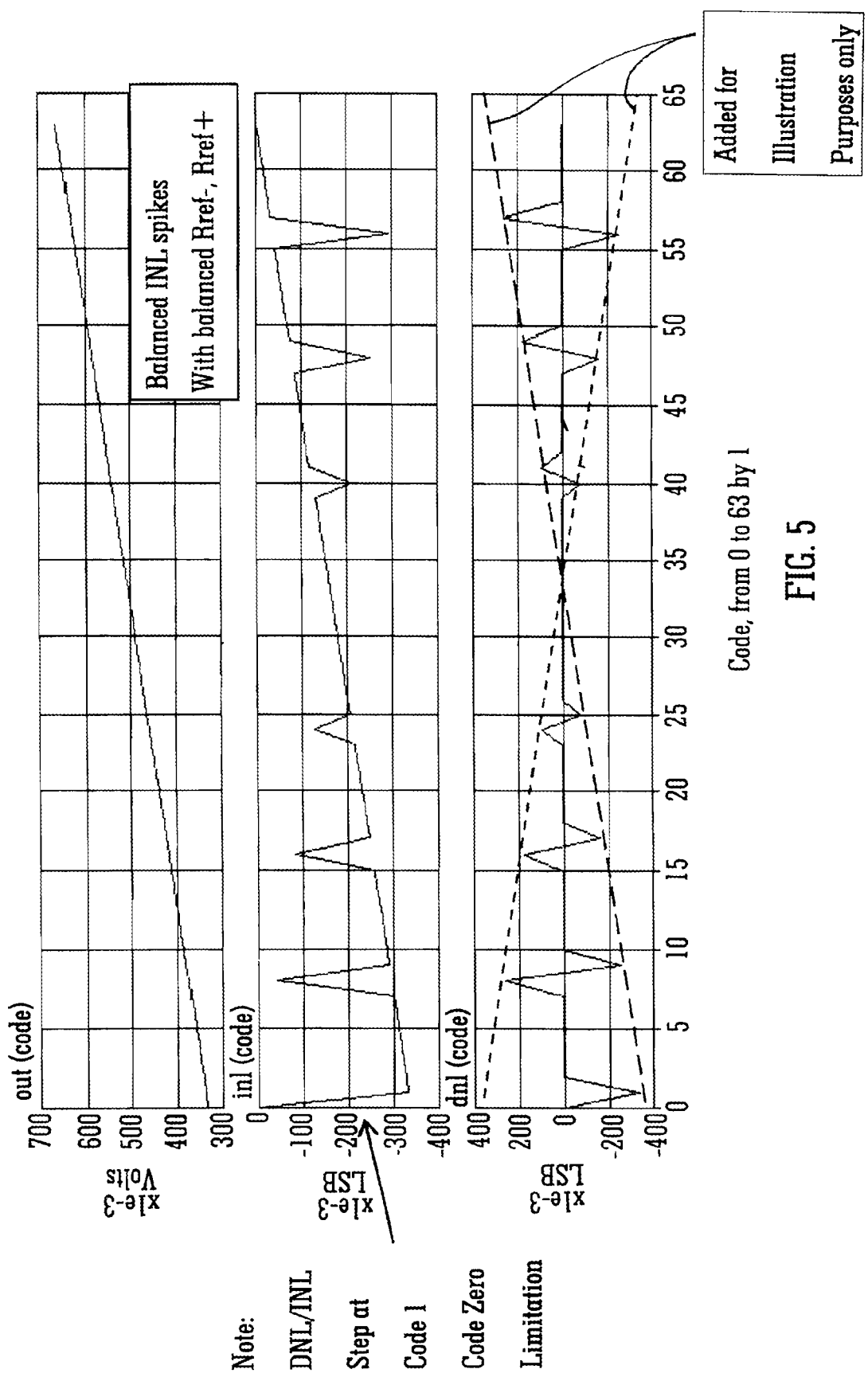
FIG. 5 shows simulation results of an ideal circuit implemented in accordance with the present teaching.

By scaling these source impedances it is also possible to reduce linearity errors, as is supported by the simulation results of FIG. 5.

Figure 6:
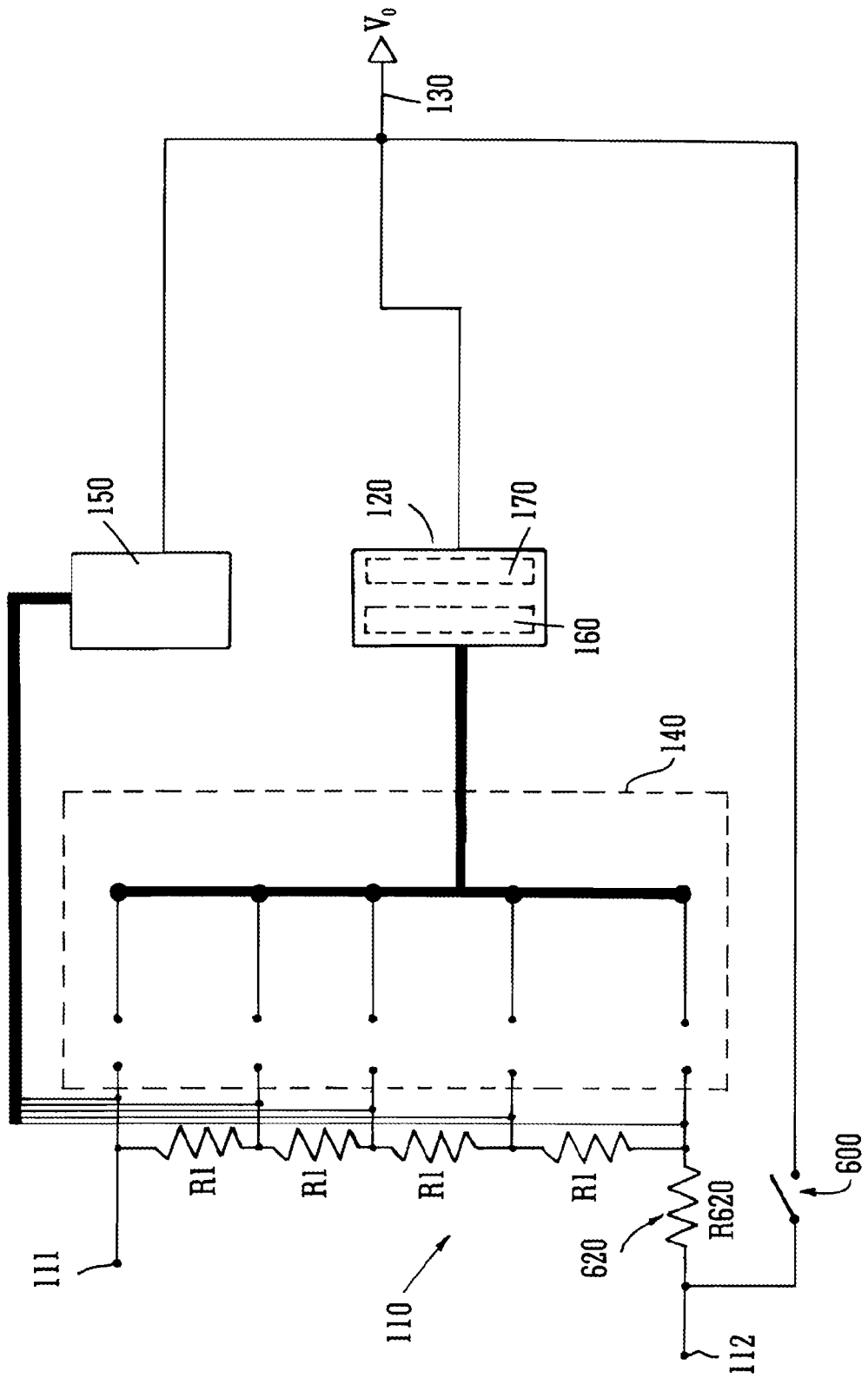
FIG. 6 is a block architecture schematic showing details of a modified circuit in accordance with the present teaching.

It will be further appreciated that in the configurations described heretofore that at a lower end of the first string there may be potential issues regarding lower value codes. It will be understood that lower reference voltages should desirably provide a zero output code. This desirous implementation could be in conflict with the architecture shown thus far as the lower end of the first string may not be able to provide such a zero output, it being configurable to provide 1 LSB. To compensate for this, the present teaching provides in certain configurations—an example of which is shown in FIG. 6—a switch 600 coupled to the lower reference terminal configured to switchably couple the reference terminal directly to the output 130 of the DAC. In addition to the switch 600, such a configuration provides an additional impedance element 620 as an extension to the first string 110. However, this impedance element does not typically have a value equal to that of the impedances of the other impedance elements in that first string. Desirably, its value, R620, is chosen to provide 1 LSB at the end of the string—this may in certain configurations be determined from the equation $R620=R1/2^{n2}$.

This switch 600 may be considered as part of the non-current carrying switch network 150. In this way, a switching of the switch 600 additional selectable configuration to provide a zero output for the DAC transfer function.

Figure 7:
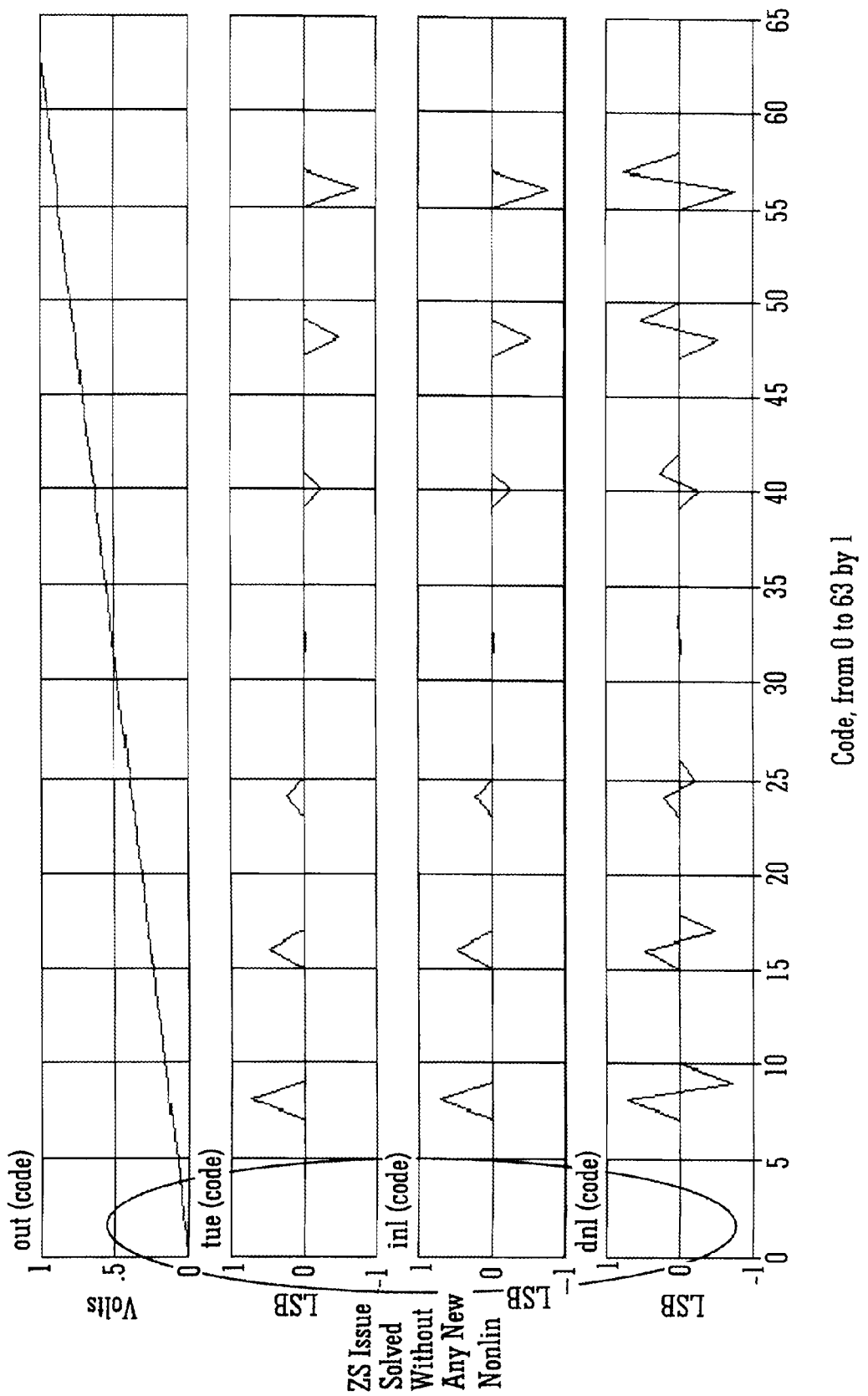
FIG. 7 shows simulation results of an ideal circuit implemented in accordance with the present teaching per the architecture of FIG. 6.

The results of the simulation of such a circuit as shown in FIG. 7 illustrates how the incorporation of such a switch may be used to address zeroscale issues without introducing any new non-linearities.

Figure 8:
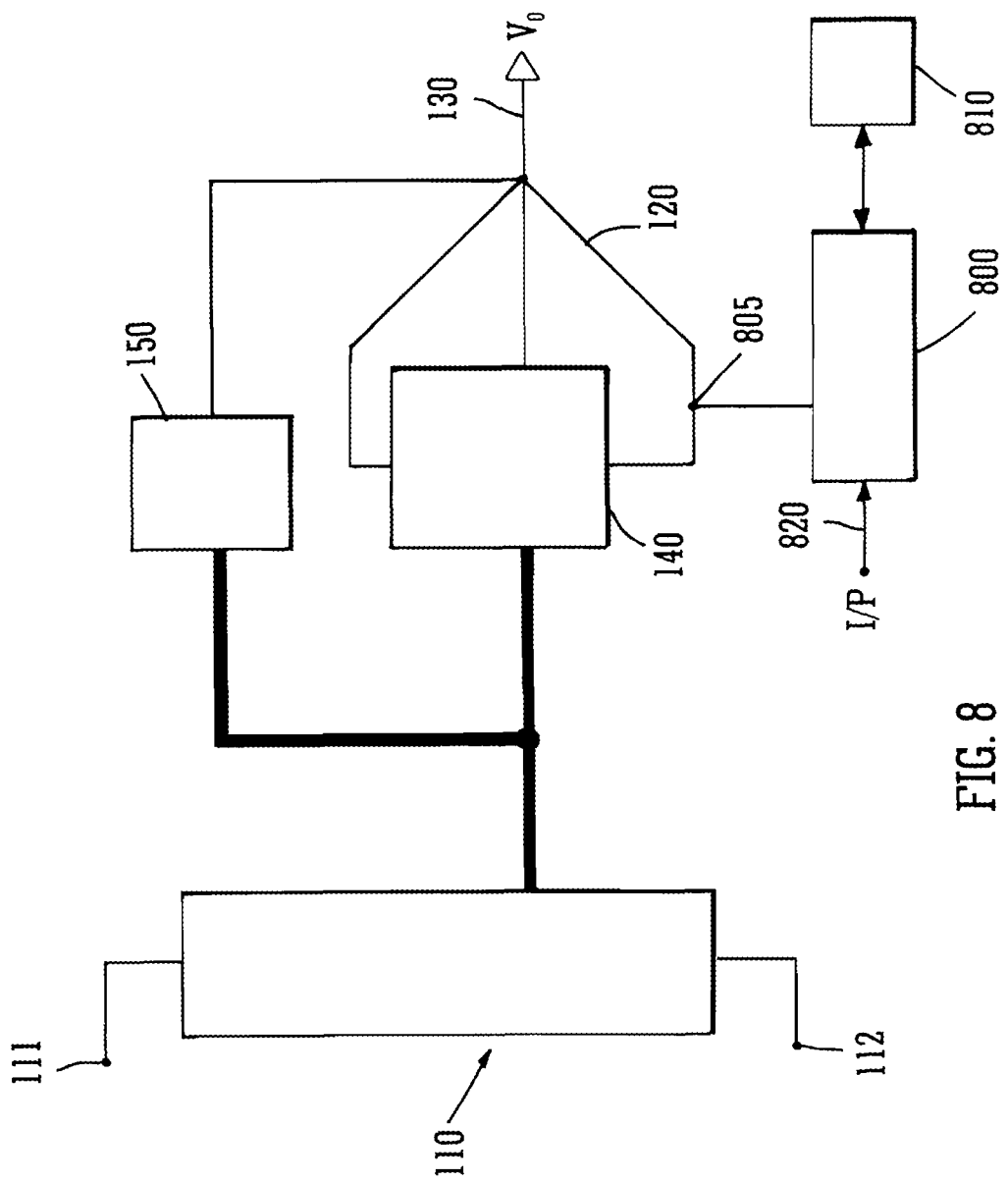
FIG. 8 is a block architecture schematic showing details of a modified circuit in accordance with the present teaching.

However as shown in FIG. 8, another modification to the circuit heretofore described may provide a control loop 800 coupled to the second string 120. This control loop 800 may also be coupled to a reference impedance element 810. Using this control loop it is possible to tune or vary the $2^{nd}$ string impedance vs MSB code to compensate for MSB code and/or analog signal level dependence.

The arrangement of FIG. 8 shows an impedance tuning solution that is based on a reference target resistance. It will be appreciated that ideally code dependent variations of R2 and Ron would be tuned, or controlled, but, using an understanding that the resistance R2 dominates as the impedance element of the 2nd string DAC, for a reasonable 2nd string DAC resolution, may be sufficient to only tune Ron and not both R2 and Ron.

It will be appreciated that the choice of impedance element required is not specific and that examples such as polysilicon resistors, thin film resistors, diffused resistors, MOS device etc. could be used. Furthermore, the $2^{nd}$ string impedance elements may be made from MOS devices where the gate drive voltage is tuned to yield the variable, desired on impedance (or Ron) at the target common-level. This works well if the voltage range across the 2nd string is low e.g. where the resolution of the first resistor string is reasonably high and/or the reference range is low.

The tuning may be provided based on a digital or an analog input 820. For example a MSB DAC code input (digital input control basis) or analog signal level input, achieved through a coupling to the MSB DAC terminal or LSB DAC network could be advantageously employed. In this way the control loop may be configured to tune or vary the second string impedance with reference to an MSB code to compensate for the MSB code or to tune or vary the second string impedance with reference to an MSB code to compensate for analog signal level dependencies or indeed both.

Figure 9:
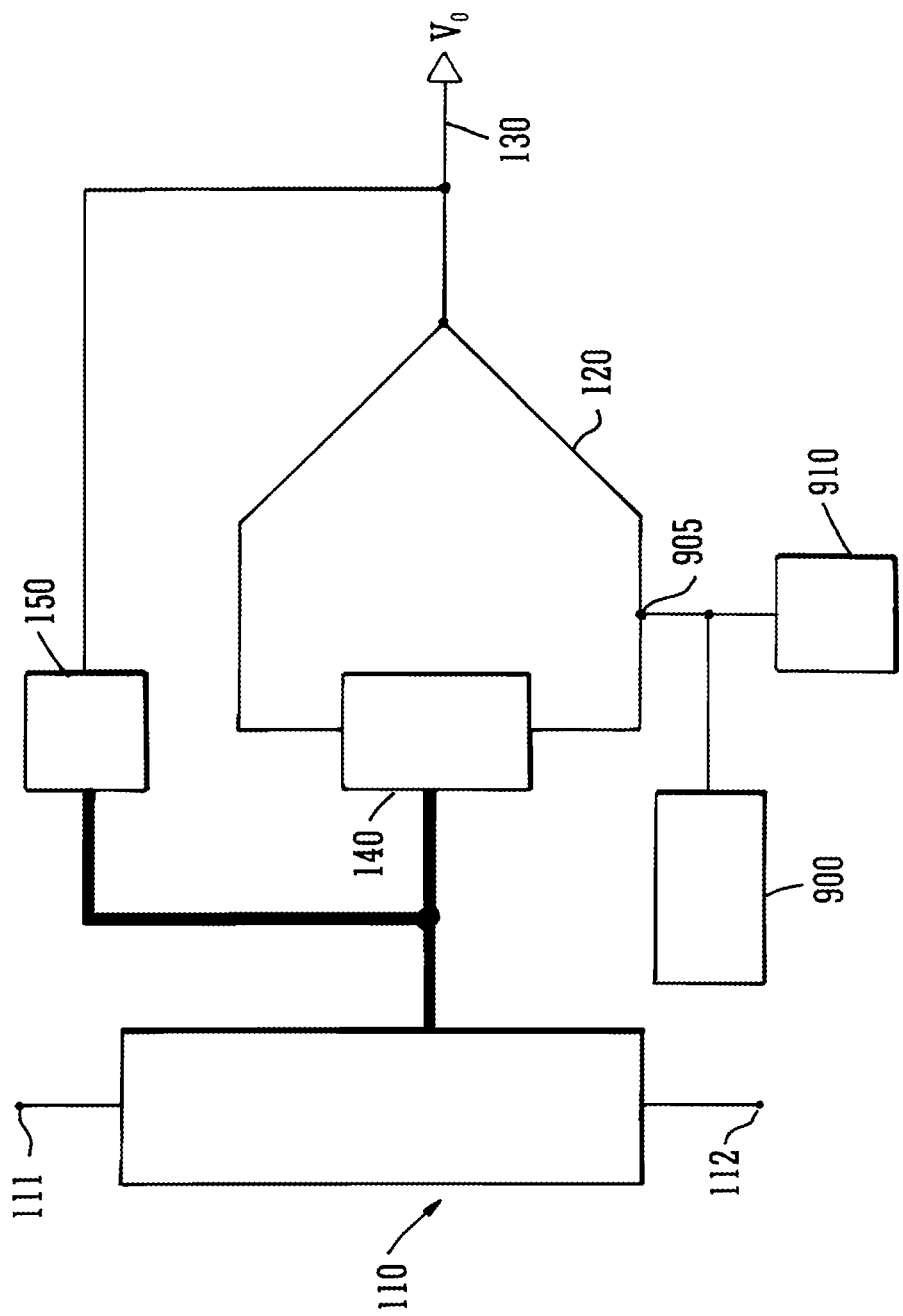
FIG. 9 is a block architecture schematic showing details of a modified circuit in accordance with the present teaching.

FIG. 9 shows a further modification whereby the $2^{nd}$ string is coupled to a compensation current source 900 or current sink which provides a compensation to modulate a reference for MSB transitions. In this way it is possible to realign the MSB to correct for TUE and other nonlinearity errors. It will be appreciated that this could be provided at one or both reference terminals of the $2^{nd}$ DAC string—FIG. 9 only shows the coupling to a lower terminal 905. Such an arrangement allows for a sinking of current in lower codes to remove the TUE. It also may be used to reduce or substantially eliminate TUE errors by sourcing or sinking currents when compensation is required.

It will be appreciated that the configurations described above with reference to FIGS. 8 and 9 relate to a use of active circuits to compensate for a loading effect applied to the $2^{nd}$ string, or LSB DAC to make this loading work with the MSB DAC transition in hi-z modes.

In another configuration described with reference to FIGS. 10A and 10B it is possible to use a passive solution to change the MSB transitions (from a hi-impedance configuration in the four state and five state implementations described above) such that the MSB DAC transitions match the desired lower impedance second string 160 with R2=R1/2 characteristics.

Figure 10A:
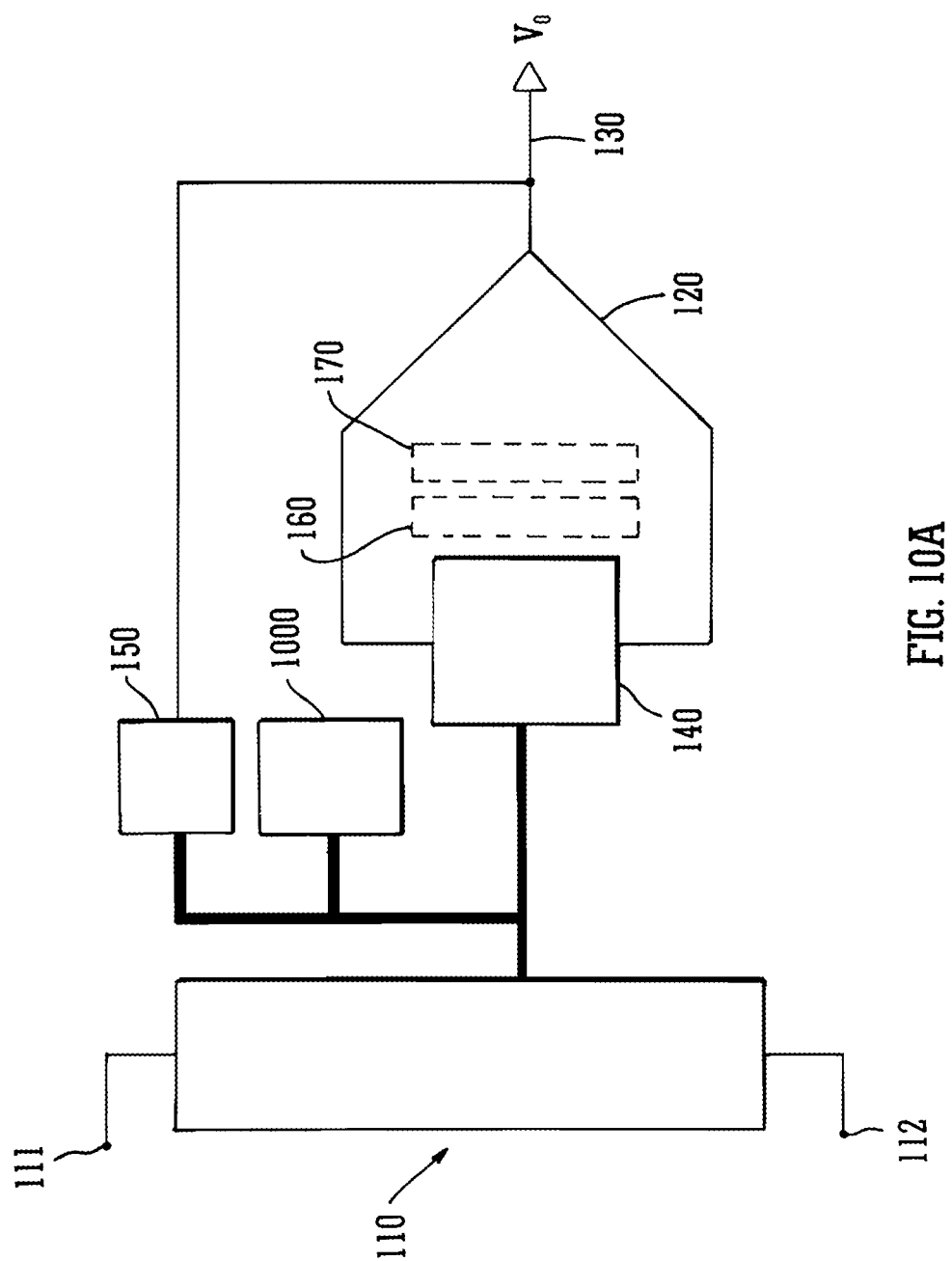
FIG. 10A is a block architecture schematic showing details of a modified circuit in accordance with the present teaching.

In this configuration of FIG. 10A, output terminals of the first string are coupled to the second switching network 150, the second DAC block 120 and a load circuit 1000. The load circuit 1000 is configured such that its impedance may vary with selected input codes to compensate for code dependency and the load 1000 may be provided as a variable load dependent on code. Rload 1000 can be coupled to a switching network 140 so as to allow selective switching of individual ones of the impedance elements of the MSB string 110. In this way a load drop can be provided on the MSB string 110 to generate multiple LSB transitions. Providing these new load states with separate loading circuit 1000 enables a reduction of voltage across the 2nd string when in use. This has positive impacts including reducing the number of 2nd string states proportionally and in certain scenarios may also reduce the target 2nd string unit resistance also.

It will be seen that each of the second switching network 150 and the load circuit 1000 provide a second switching network coupled to impedance elements in the first string, the first switching network being provided by the switching elements of the block 140. Selective switching of the first switching network and the second switching network provides a first and a second switched current path from individual impedance elements of the first string to provide multiple state changes at the output node.

While this provides an arrangement that can be implemented using a passive solution without requiring active sources and also does not require buffering between the DAC stages, it will also be understood that this passive solution can be supplemented using control loops and/or active injection of additional currents. In this way it will be appreciated that the injection of additional currents can affect a change in the output.

In this way it will be understood that there is provided a second switching network providing multiple switched paths which compensate for impedance effects of the second string and provides multiple state changes at the output node. In a first configuration the switching path is coupled to impedance elements in the first string and selective switching of the first switching network and the second switching network provides a first and a second switched current path from individual impedance elements of the first string. In another configuration the second switching network couples a current source into the DAC which can have a compensation effect on the impedance effects provided by the second string and provide multiple LSB transitions.

This second switching network can be used in combination with use of the first switching network or during operation of the second switching network, the first switching network could be decoupled from the first impedance string.

Where provided in the first configuration, desirably, this load impedance may be implemented in the form of a parallel load circuit whose impedance varies with selected $1^{st}$ string 110 (or code) on or about the 1st string mid-string which is mid-scale where voltage terminals are driven by voltage sources with negligible source impedances. The load circuit is configured to provide a high impedance load at a midscale point of the DAC transfer function and is coupled, in this arrangement, in parallel with an impedance element of the first string below the MSB node that provides a code greater than the midscale point and is coupled in parallel with an impedance element of the first string above the MSB node that provides a code less than the midscale point. It will be appreciated that this load circuit 1000 can be used to deliver a load on or about midscale—either a positive or negative load—when the second DAC stage 120 is de-coupled from the first string 110.

In this way it will be appreciated that in this configuration the LSB across the switching network is sensed using the block 150 but, instead of using a hi-impedance node at each MSB DAC transition, the load circuit 1000 which is configured to provide +/−resistance around the high impedance centre is used in parallel with a selected MSB DAC resistor for the special case at the impedance centre where a zero load corresponds to a high-impedance mode. In this way a passive solution is provided to change the first string levels in combination with low impedance 2nd string loads.

It will be appreciated that in another arrangement it is possible to provide a configurable load resistor used in series with the LSB DAC which would allow a re-use of resistors provided in the $2^{nd}$ string. It will be appreciated therefore that provision of the circuit in parallel or series could be considered.

However, and while provision of a load circuit in series is possible, a circuit provided in parallel may be preferred for a number of reasons including:

Resistance of LSB DAC is low versus target load and hence the contribution will not be very significant and hence there may be disadvantages in combining this load circuitry with/in the LSB DAC;

Parallel solution has substantially no impact or influence on LSB DAC design;

Parallel isolation switches preferred;

No additional circuitry slowing down LSB DAC operation which does not detract from an overall advantage of the circuit in general which provides a high speed DAC;

The load circuitry does not have high linearity matching requirements (different from the LSB DAC) as maximum precision is not required;

The load resistance can be made from different size resistors and all best practice matching design is not required as maximum precision is not required.

However, independently of the way that the way that the load circuit is provided, the load circuit may be configured to provide a positive or negative load around a midscale point of the DAC transfer function during a de-coupling of the second string from the first resistor string. The load of the load circuit may be determined from $$R\text{load} = (2^{n2}-2) * R_{DAC1},$$

Where:
Rload is the load of the load circuit;
N2 is the number of states provided by the second string 160;
$N2-2=2^{n2}-2$ is the number of n2 bit LSB DAC impedance elements in the second string 160;
$R_{DAC1}$ is the sum of the resistance of the first resistance string 110 and the ON resistance of the first switching network 140.

It will be appreciated that irrespective of how the load of the load circuit is determined, the Ron of the Rload switches are part of the total DAC impedance network. In this way, it will be appreciated that in accordance with the understanding that scaled, smaller switches are desirable to reduce the Rload area and leakage contributions of the switches whilst also providing higher resistance desired by Rload that it is possible to provide switches in the Rload circuitry may have for example a ½ or ¼ the size of MSB DAC switches and this provide 2× or 4× the resistance. Furthermore, the load circuitry does not have high linearity matching requirements— in contrast to the requirements of the LSB DAC block such that the load resistance can be made from different size resistors and all best practice matching design is not required. It will however be appreciated that despite these non-requirements it is desirable to adopt reasonable design and layout practice to ensure process and layout dependent effects do not impact on the performance significantly.

Figure 10B:
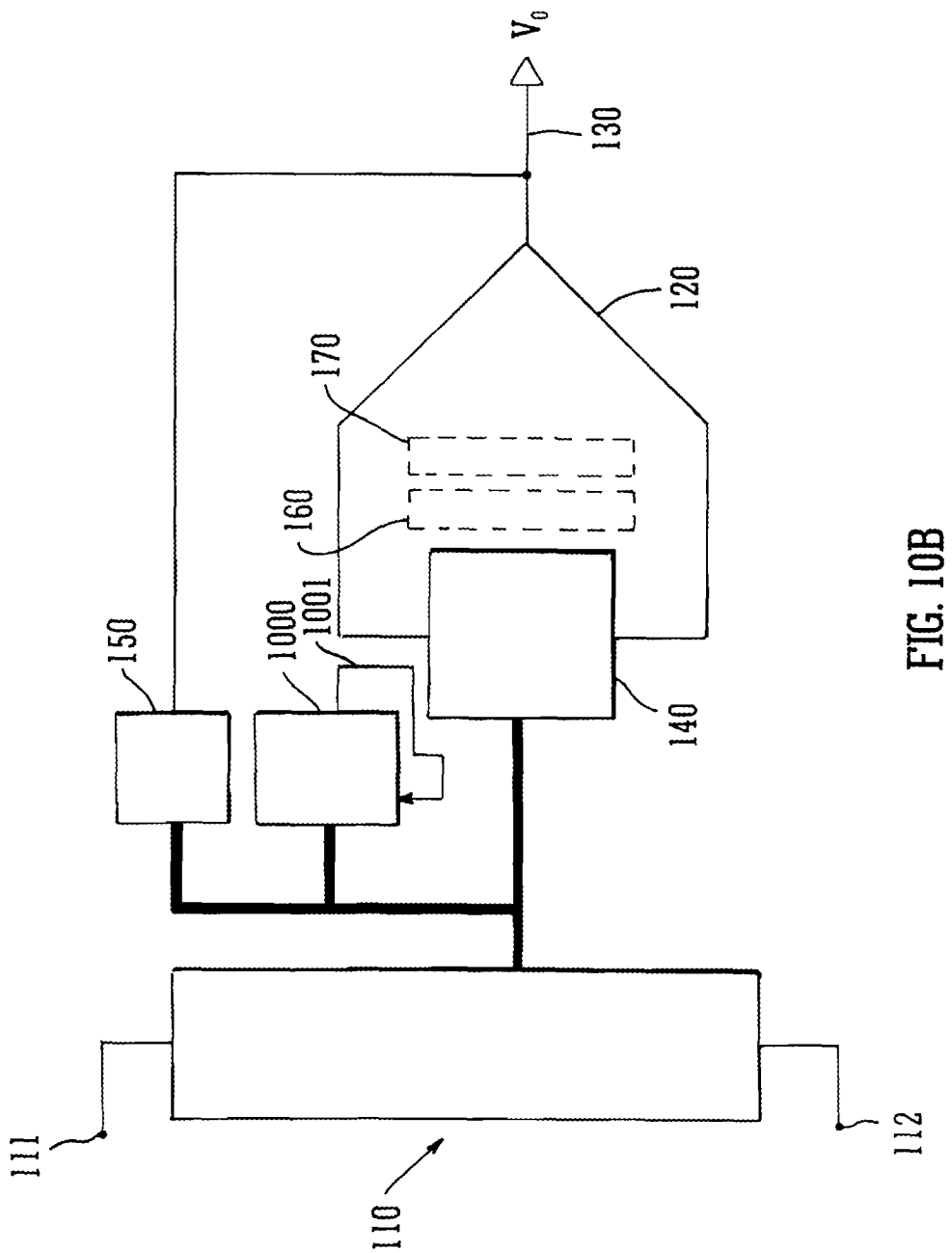
FIG. 10B is a block architecture schematic showing details of a modified circuit in accordance with the present teaching.

In the modification to the circuit of FIG. 10A, shown in FIG. 10B, the load circuit 1000 is coupled to a re-compensation circuit 1001. The switching network may comprise multiple switches of different switch types and the re-compensation circuit 1001 may be configured to compensate for variances in the response characteristics of the individual switches different types.

Figure 10C:
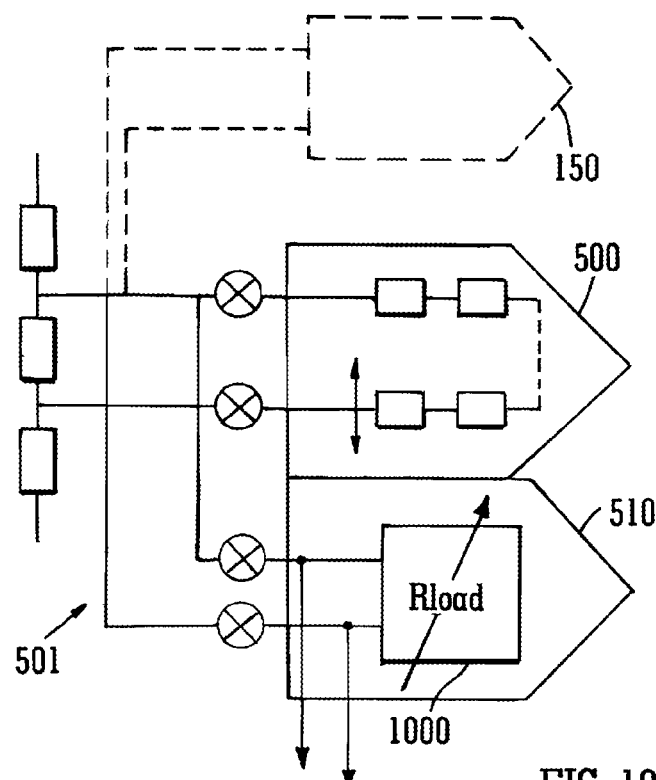
FIG. 10C is a schematic showing an exemplary parallel implementation of a load circuit per the teaching of FIG. 10A.

FIG. 10C shows an implementation of these circuits whereby the Rload 1000 can be selectively switched with the MSB string so as to provide first 500 and second 510 parallel sub-DACs from the MSB DAC string 110. This block 510 is in effect a digitally controlled impedance and therefore can be considered as providing variable DAC transition states as part of the overall DAC architecture, dependent on the impedance level selected. The first 500 sub-DAC comprises the LSB string discussed previously and by coupling the second 510 sub-DAC separately to the MSB DAC string it is possible for each of the first 500 and second 510 sub-DACs to work separately with the MSB DAC string but provide complimentary sub-parts of the LSB DAC function. By providing the Rload as an additional sub-DAC it is possible to increase the degrees of freedom with which LSB transitions may be generated with respect to an incoming digital word. Furthermore the size of the switches 501 that are used to couple this Rload to the MSB DAC string may be reduced. It will also be appreciated that the switches to Rload and those switching the DAC function have similar common mode operating characteristics (which may be advantageous for matching purposes) and can therefore be similarly sized and can provide dummy switches for each other.

The use of Rload 1000 allows the user to set a scaling ratio between Rdac1 and Rdac2 and this then sets the number of states and the resolution required for the sub-DAC 501.

For example using a specific example of two LSB states yielding half a scalar value, it is therefore possible to reduce the size of the R2 provided by the second DAC string, to values approximating ½ that of R1. It will be appreciated that this is an example and the present teaching should not be constrained to such implementations.

Figure 10D:
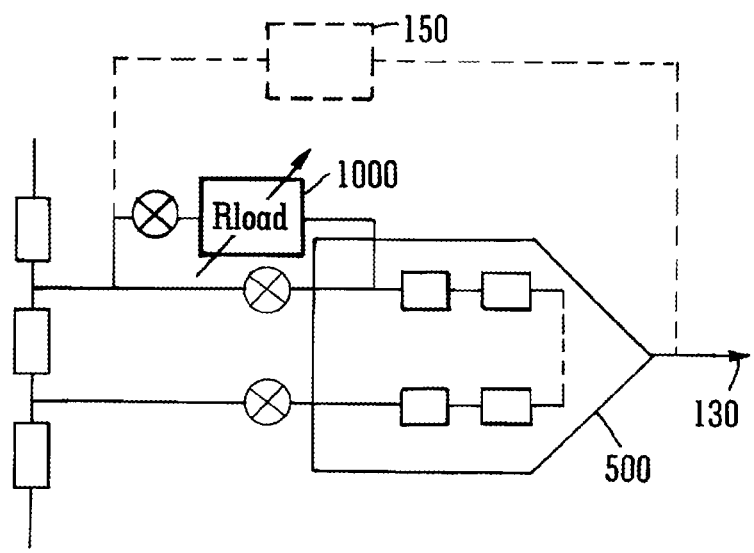
FIG. 10D is a schematic showing an exemplary series implementation of a load circuit per the teaching of FIG. 10B.

In the schematic of FIG. 10D, Rload 1000 is provided in series with the second string. In this way there are multiple load moves available from the first DAC string 110. In a first move, the second string 120 is coupled directly to the first string and can be used optimally for mid LSB transitions. In a second switching configuration, the Rload can be switched in so as to provide end of LSB DAC range transitions. In this latter configuration, the LSB output is derived from a contribution of both the Rload and the second DAC string 120.

Figure 10E:
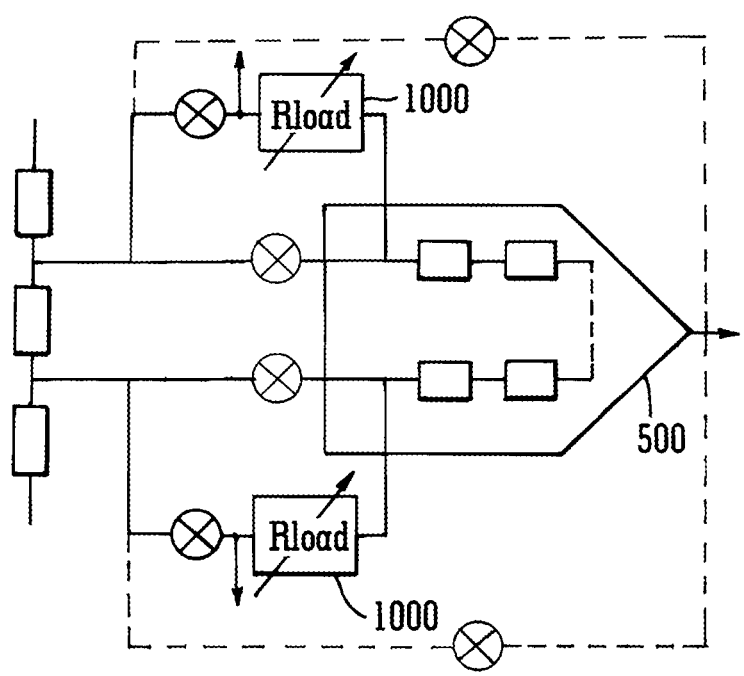
FIG. 10E is a schematic showing an exemplary series implementation of a load circuit.

It will be appreciated that modifications can be made to the circuit described in FIG. 10D. As shown in FIG. 10E, the Rload can be switchably coupled to any node of the first string. By providing separate Rloads at both the top and bottom levels of the stage 500 it is possible to switch these individually as opposed to requiring multiple switches. It will also be appreciated that by providing separate Rloads the node voltages throughout the DAC network in times when the Rload is not coupled are similar and the voltages change gradually during the transition states which can be preferable in terms of the resultant DAC transfer function precision.

In another configuration, the Rload may be provided in series with at least one reference terminal. Another configuration which could be used for the implementation of either FIG. 10 or 11 is to provide a master switch for concurrently coupling the two load elements (Rload and the load provided by the second DAC string) together. Such a configuration may be advantageously employed in certain scenarios as it enables (1) re-use of the LSB DAC impedance reducing circuitry size/area/cost and (2) using the LSB DAC during the additional load mode ensures the self-capacitance of the LSB DAC is retained at/near the required common-mode voltage and can reduce glitching when/of the LSB DAC is re-connected directly in parallel to an MSB DAC resistor e.g. in ramping up and down the DAC codes.

Figure 10F:
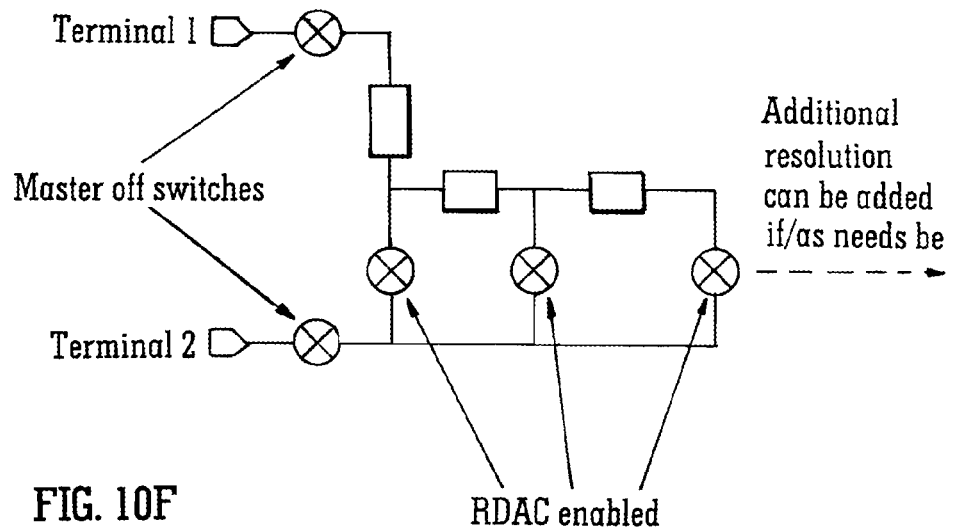
FIG. 10F shows exemplary circuitry that can be utilised with a circuit per the teaching of FIG. 10B.
Figure 10G:
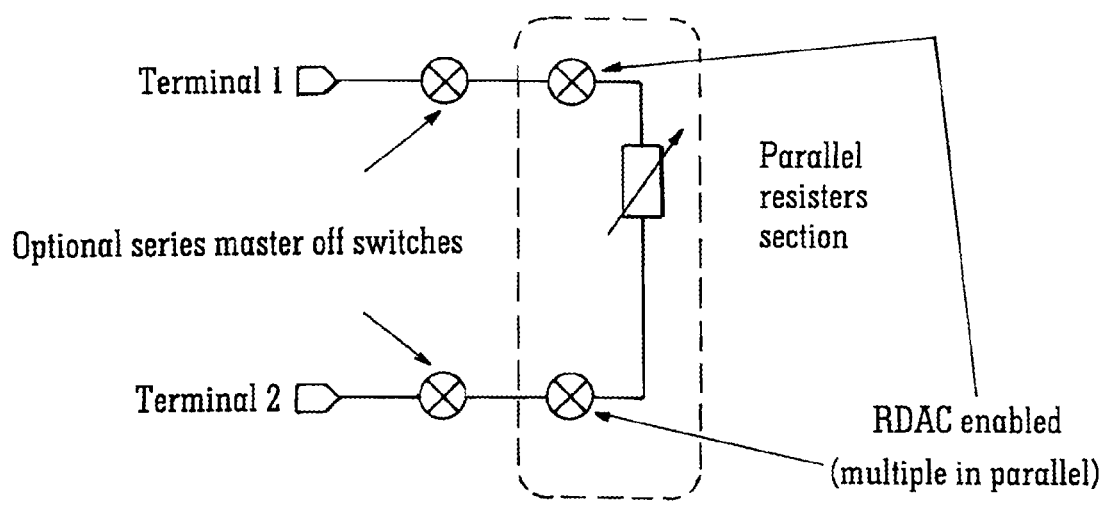
FIG. 10G shows exemplary circuitry that can be utilised with a circuit per the teaching of FIG. 10C.
Figure 11:
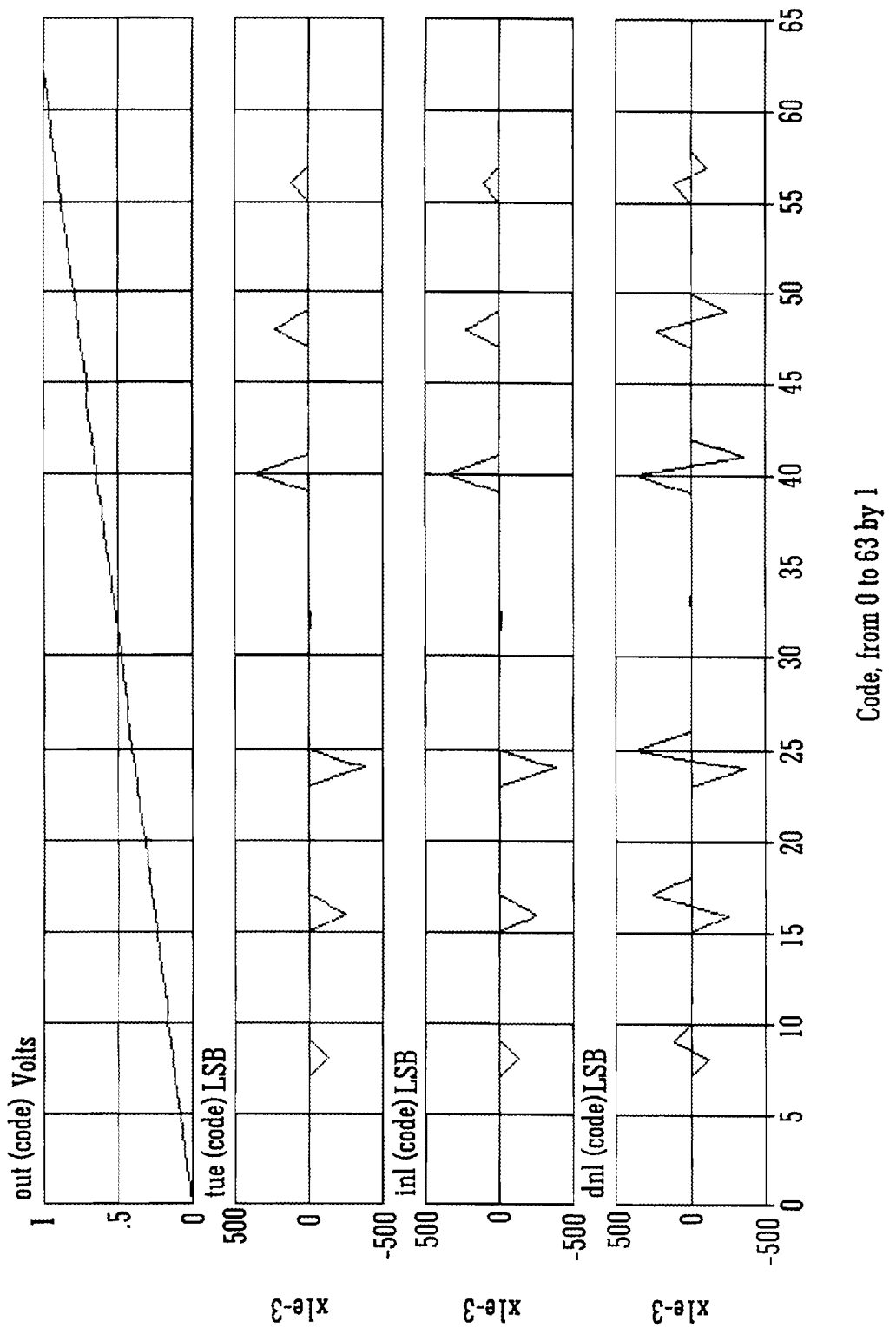
FIG. 11 shows simulation results of an ideal circuit implemented in accordance with the present teaching.

Whilst it is not intended to limit the present teaching to any one specific implementation of how Rload may be implemented, FIGS. 10F and 10G provide two examples that could be considered. The example of FIG. 10F is best used for the series implementation of FIG. 10D whereas that of FIG. 10G is best used for the parallel implementation of FIG. 10C. It will be understood and appreciated many known configurations or variants can be used with parallel/series network and ladder network combinations with resistors and active components as desired. Dependent on the design constraints, the parallel option may be preferred verses a series implementation due to symmetry OR series may be preferred due to lower area.

Low resolution Rload may be useful in many cases and hence simple configurations may be usefully implemented. It will be understood that switch impedance and track impedance should be considered and optimized in the design of the switch network, as is known to those skilled in the art. It will also be appreciated that passive impedance elements could also be provided in series. For the sake of completeness the following examples of digitally variable resistors which may be usefully deployed within the context of the present teaching are incorporated herein by way of reference: U.S. Pat. No. 5,495,245, U.S. Pat. No. 6,414,616, U.S. Pat. No. 6,567,026 and U.S. Pat. No. 7,956,786.

FIG. 11 shows an example of simulation data for such a circuit from which it is clear using such a configuration it is possible to reduce systematic MSB transition nonlinearity error down to an acceptable level. It will be appreciated that while the error is not reduced completely to zero that given other systematic and non-systematic device contributions which become more significant and arise from for example device mismatch and MOS switch leakage, this reduction is sufficient. It will also be appreciated that by increasing the resolution of the DAC, the error is scaled proportionally.

Figure 12:
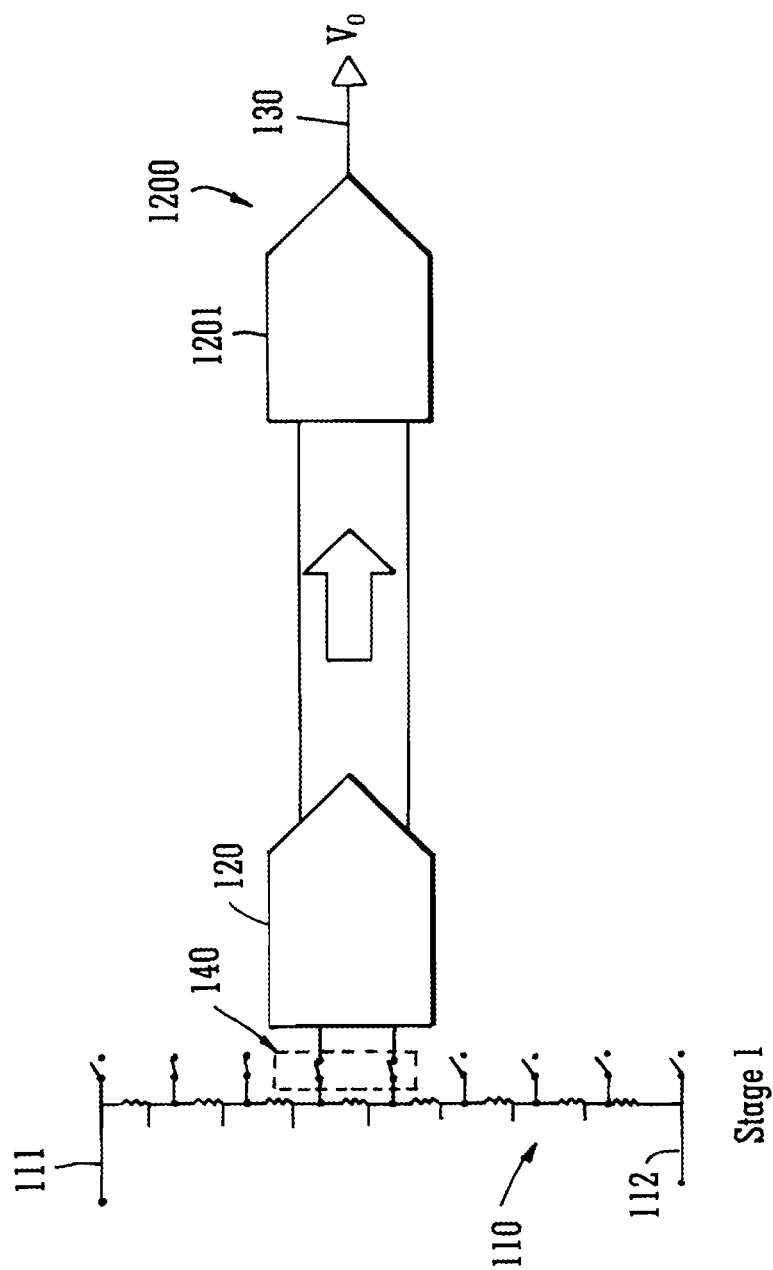
FIG. 12 is a block architecture schematic showing details of a circuit in accordance with the present teaching.

The arrangements heretofore described have been with reference to first and second DAC stages. In a further modification, an example of which is described with reference to FIG. 12, the present teaching may provide a circuit 1200 comprising M DAC stages where M is greater than 2. Traditionally it has been understood that by cascading multiple stages the result is an addition of the loading effect. However by implementing an arrangement such as described heretofore it is possible to avoid this traditionally conceived limit due to a summation of error contributions (Ron+Rpar) of inter-stage switches used to couple each of the individual stages. In the example of FIG. 12, which for the sake of convenience uses the same reference numerals for components already described, in such a configuration each DAC stage 120, 1201 comprises a string of impedance elements and a switching network. As will be appreciated from the description heretofore of the second DAC stage 120, such a stage will comprise a string 160 coupled to a switching network 170.

Figure 13A:
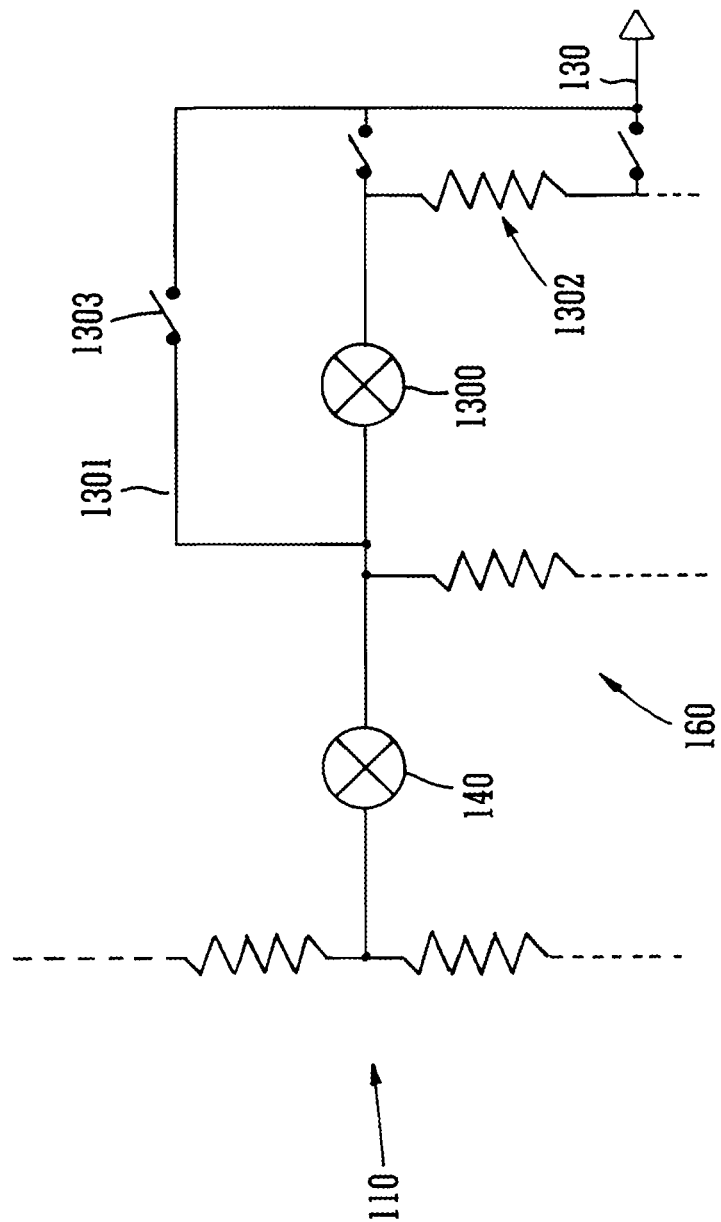
FIGS. 13A and 13B are partial schematics of examples of a three impedance string stage design highlighting more complex switching near terminations of the impedance strings that may be provided in accordance with the present teaching.

It will be further appreciated that similarly to that described before a switching network 140 between neighboring DAC stages may provide shared switches for each of the DAC stages that it switchably couples—FIG. 13A shows an example of elements of a switching network 140, 1300 which as described above may provide individual switches for each of the two stages 110 and 160. It will be appreciated that these elements form part of a larger switching network. The switching networks between neighboring DAC stages are useable to couple currents passing from a first string 110 through the switching network 140 to a second string 160, or from the second string 160 through the switching network 1300 to a third string 1302.

Figure 13B:
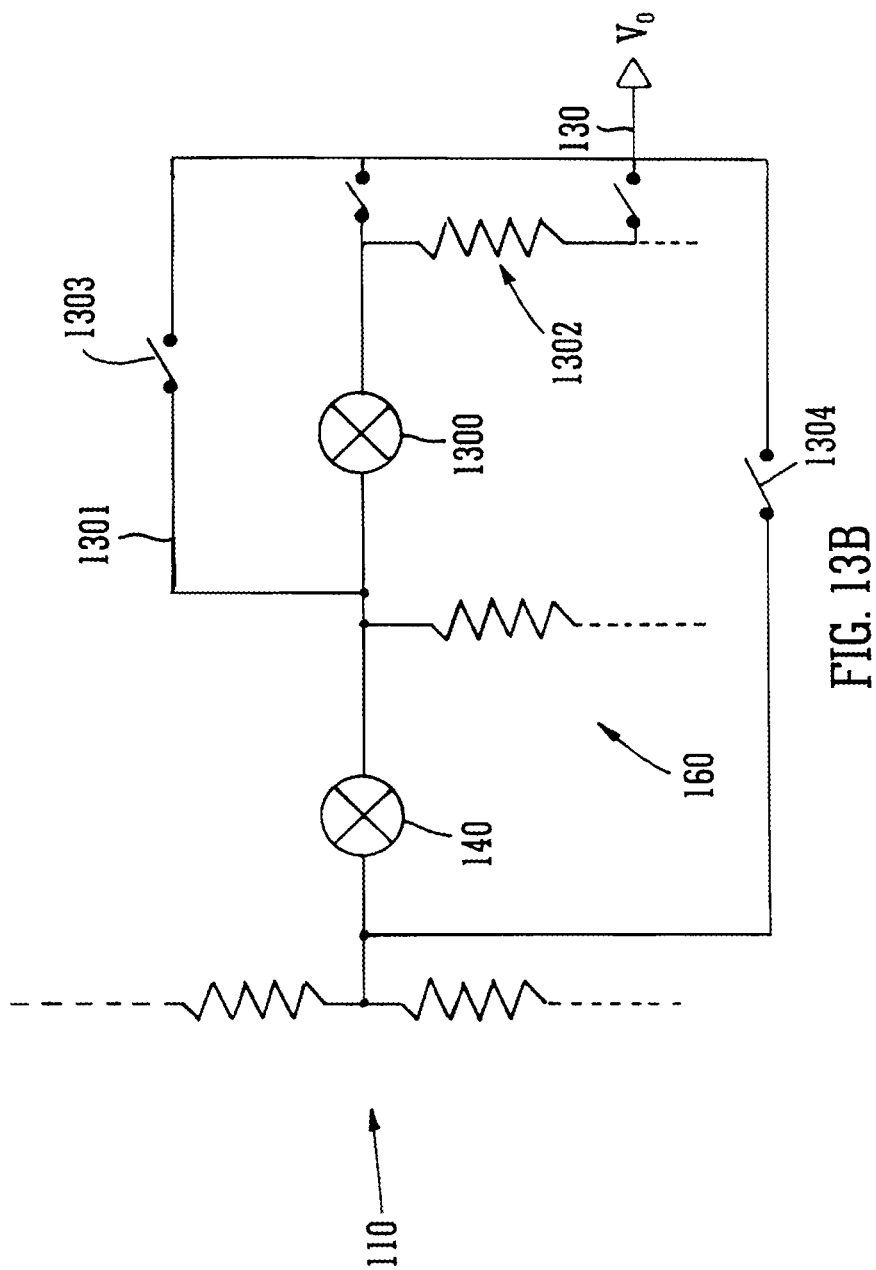
Figure 14:
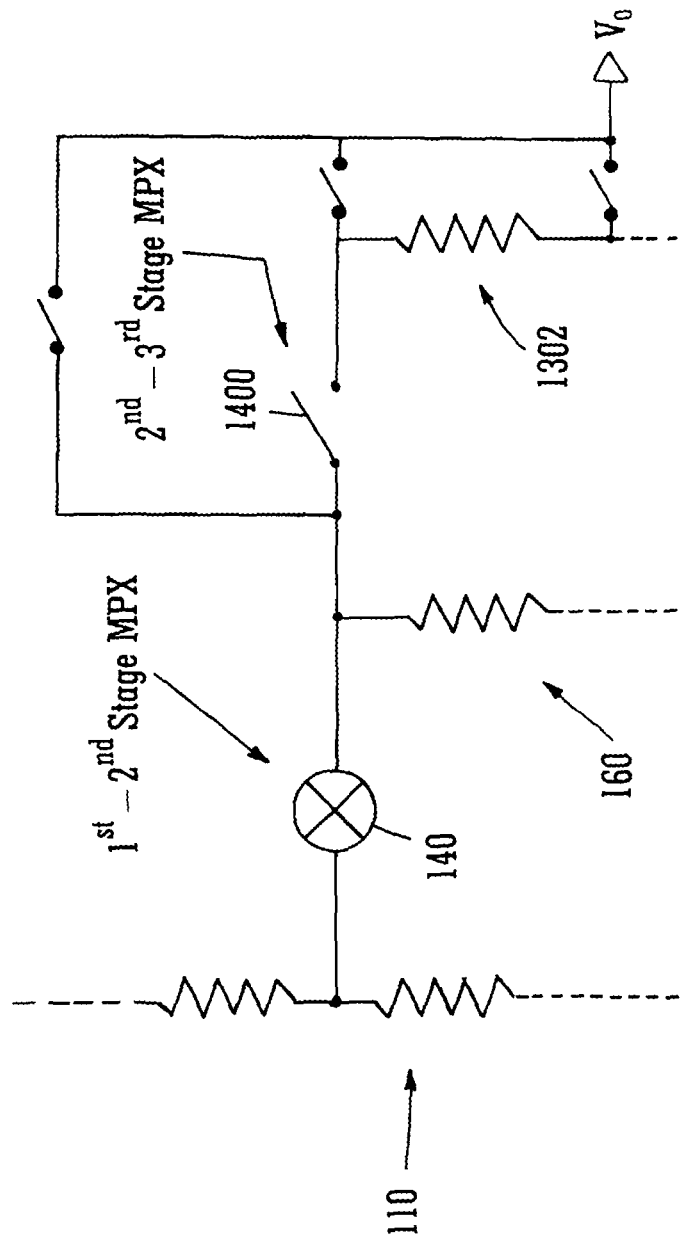
FIG. 14 is a schematic showing details of an alternative circuit in accordance with the general principles described with reference to FIG. 12.

In a variation to that described before, in this configuration multiple outputs 130, 1301 from the DAC circuit may be provided. For example in a first configuration—shown in FIG. 13a—the output of the circuit can be switched from a final DAC stage 130 to a node 1301 between intermediary DAC stages. In another configuration—shown in FIG. 13b—the output of the circuit can be switched from a final DAC stage 130 and from a node 1301 between intermediary DAC stages. In the arrangement of FIG. 14 a further switch 1400 may be provided through between the individual stages and this may allow various switching options be used between stages.

The impedance of each switching network between neighboring DAC stages is desirably sized so to yield 1 LSB steps when it is coupled or de-coupled from preceding stage at the output.

By providing a plurality of DAC stages it is possible to reduce the number of impedance elements, typically resistors, provided in the DAC. As before each DAC stage comprises a string comprising a plurality of impedance elements for each successive stage it is possible to reduce the number of actual impedance elements required in each successive string. In contrast to prior art implementations an arrangement in accordance with the present teaching does not require a switching of the impedance elements to provide the sole contribution to DAC transfer function and this provides additional optional states that may be used as required. It will be appreciated and understood that the number of states provided by a DAC is desirably greater than or at least equal to the number of states needed in operation of the DAC. By providing additional states without actually requiring a switching of the impedance elements that make up the individual strings of the multiple string DAC network, a DAC in accordance with the present teaching achieves this operating criteria. By providing additional states at the end points it is possible to provide same with negligible contribution to errors.

As an example of the type of arrangement that may be provided in accordance with the present teaching a 12 bit DAC using three impedance strings may be designed as follows. It is notable that in such an arrangement a 7 bit DAC functionality for stages 2 & 3 works out conveniently in terms of factorization. Using such switching yields the number of states required as being 128−7=121 states. This 121 number factorizes efficiently to 11*11, requiring only 18 resistors for this 7 bit DAC functionality. This 7 bit second and third stage resolution can be used with a 5 bit binary $1^{st}$ stage string (with 32 resistors) to give an overall 12 bit DAC implemented with only 50 resistors.

If one of what can be considered optional states is not used in the same way on both sides of MSB resistor transition, this number of transition states drops from 7 to 5 states and this may be desirable in terms of the resultant number of states may be more amenable to factorization.

It will be appreciated that different configurations can be provided between individual stages of a multi-stage DAC network. For example, in a three stage network, a first configuration could be provided between a $1^{st}$ and a $2^{nd}$ stage, a different configuration between the $2^{nd}$ and a $3^{rd}$ stage and another configuration at the output of the $3^{rd}$ stage. In one example where there is a need to provide N states, this could be provided by the $1^{st}$ stage providing N1 states, the $2^{nd}$ stage N2 states, the $3^{rd}$ stage N3 states and a $4^{th}$ number of states provided by a non-specific string arrangement N4. It will be appreciated that the $1^{st}$ stage with its resistor string will typically be used to provide the largest proportion of the desired resolution. Once this is computed it can then be determined how much resolution is required from each of the successive stages. By providing a non-specific string arrangement, it is possible to use this contribution element to provide a fine tuning of the precision requirements for the overall DAC conversion. It will be appreciated that this precision will typically be provided by providing a small N4 arrangement relative to the other components of the DAC, this providing reduced complexity in the overall architecture.

In such a scenario:

$$N=N1*N2*N3+(N1-1)*N4.$$

N1 is provided by a switching of a voltage produced across at least one of the impedance elements in a first string across a second string in response to a digital input signal, N2 is generated by a switching of the elements in the second string, N3 is generated by providing a non-current carrying switching network from the second string to the output in addition to a switching network that couples a voltage produced across at least one of the impedance elements in the second string across a third string in response to the digital input signal;

N4 is provided by a switching network providing multiple switched paths which compensate for impedance effects of the second string providing multiple state changes at the output node.

Using the example of the second switching path between elements of the first stage and the output—described above with reference to FIG. 10—N4 could be provided by the Rload component or indeed could be provided by injecting currents into the DAC architecture, albeit this latter approach being an active as opposed to passive approach.

It will be understood that the main proportion is generally provided by the product of N1 with N2 and N3 with the contributions provided by N4 being less.

Within the context of the present teaching ideally the contribution provided by N1/N4 may be a binary number as this will allow a slide transition between codes.

It will be appreciated that in such a multi-stage DAC architecture that it is possible to provide a "leap-frog" (sometimes also known as "two-hot") switching methodology to ensure that linearity offsets remain unchanged when switching from one stage to another. This can be used to ensure monotonicity.

Figure 15:
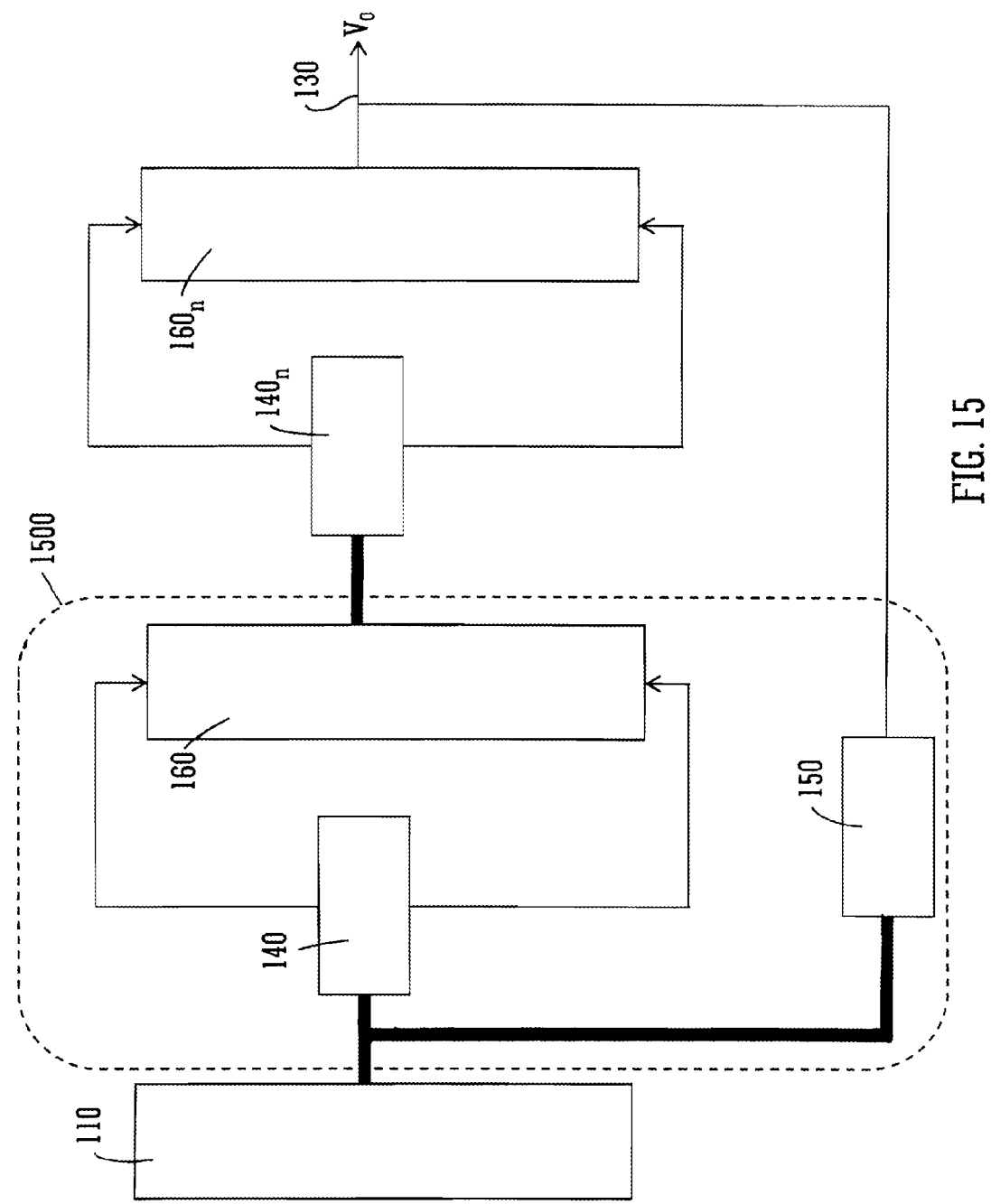
FIG. 15 shows an example of an extension of the circuit of FIG. 1A to multiple stages where the number of impedance strings is greater than two.
Figure 16:
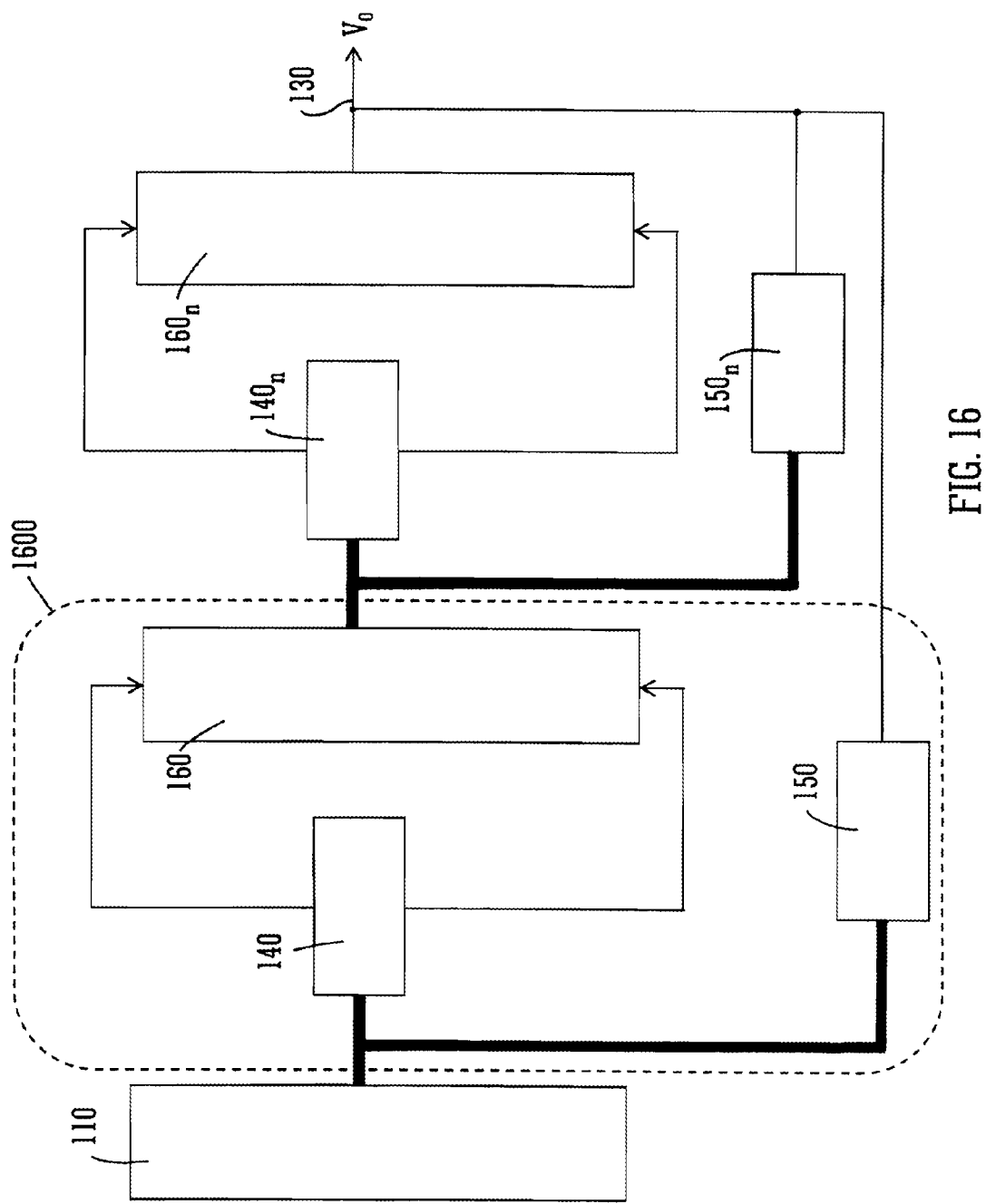
FIG. 16 shows an example of an extension of the circuit of FIG. 1A to multiple stages where the number of impedance strings is greater than two.

FIGS. 15 and 16 show examples of how this implementation of multiple stages can be provided. Building on the architecture originally shown in FIG. 1A, such a multi-stage DAC will typically incorporate first and second strings configured in a fashion described heretofore. For each of the successive stages it is possible to incorporate other DAC string arrangements comprising for example a switching network 140n coupled to a string of impedance elements—as shown in FIG. 15. In another arrangement each successive DAC block may resemble the $2^{nd}$ DAC block heretofore described in that it includes a shared switching network 140n coupled to a string of impedance elements and also including a set of non-current carrying switches 150n as shown in FIG. 16. In a further modification, not shown, the first and second stages may resemble conventional dual string DAC architecture and successive strings may be provided using components highlighted within the dashed box 1500 or 1600.

It will be appreciated that dependent on the actual configuration provided, the number of additional transitions that are required to be provided by a switching of impedance elements will vary—FIG. 15 requiring more than FIG. 16.

It will be appreciated that in the example of FIG. 16 each of the successive DAC stages comprise similar building blocks. In this example they are shown as the shared intra-string multiplexer 140n, a string of impedance elements 160n and a non-current carrying switch network 150n—the subscript n refers to the number of the stage. For example in this schematic n=3 as this is the third stage but it would be possible to replicate this for additional stages as required dependent on the design characteristics of the actual DAC being implemented.

As mentioned above as each additional stage is added to the network the number of impedance elements in the successive strings may be reduced. As the first string dominates the power consumption and provides a key part of the precision of the DAC, it will typically include a larger number of impedance elements as compared to successive stages. Ultimately, if sufficient numbers of stages are added, the number of impedance elements can be minimized. In such a configuration, the LSB transition defined by this last stage can be derived from a switching of the intra-string multiplexer 140n. As each additional stage is added a combination of loading on input and output sides of intra-string switch impedance is sized so to yield 1 LSB steps at the output from IR drops across the current carrying inter-stage switches.

It will be appreciated that the exemplary arrangements described heretofore have described in broad terms exemplary four state transition arrangements described with reference to FIGS. 1, 2 and 3 and five state transition arrangements described with reference to FIGS. 2 and 4 to 12.

With regard to the four state transition configuration, the number of n2 bit LSB DAC resistors provided in a second string can be reduced to a number equivalent to $2^{n2}-3$. It will be further appreciated that similarly to that described in U.S. Pat. No. 5,969,657, the DAC current (Idac) is substantially code independent. Furthermore as the effective resistance of the switching network (Ron) can be increased such that Ron is effectively equal to the resistance of the resistors in the second LSB string (R2) and the resistors in the first MSB resistor string, it approaches the target configuration for a $1^{st}$ DAC output switch where Ron=R2=R1. In this way as R2=R1, it is possible to provide matched devices in the first and second strings. Furthermore the resistors in the first and second string (R1 and R2) can be used as dummies for each other in layout design.

In the five state transition arrangements, the number of n2 bit LSB DAC resistors required in the second string to provide N2 states (where $N2=2^{n2}$) can be reduced further in accordance with the equation=$2^{n2}-4$. In these five state transition configuration where each of the DC transitions provide an LSB change, the resistance of each of the switch, Ron, and the second resistors, R2, can be chosen such that:

$$Ron, R2 = (2^{n2}-1)/(2^{n2}-2)*R1 \text{ where } n2 \text{ is LSB DAC resolution.}$$

It will be understood that as $N2 \to \infty$, $R2/R1 \to 1$ and it becomes similar to the four state version described above where R2=R1=Ron. Each arrangement is advantageous in that ideally R2 has a value which is very close to that of R1. In accordance with the present teaching they can be made the same for high resolution configurations, as the scalar tends to unity.

By having a configuration where the value of Ron may be increased—and may also have values greater than possible using a 4 state implementation—this allows for a reduction in the size of the actual switches used and is also advantageous in high-temperature, and low supply range applications and wide common mode operations. With regard to the latter two aspects it will be appreciated that switch resistances vary as a function of common-mode or bias voltage and higher Ron can translate to wider common-mode range of operation which is advantageous. With regard to the benefit to the supply range it will be understood that MOS switch resistances tend to be much higher at lower supply levels, with reduced gate overdrive voltage, Vgs-Vth. Generally, CMOS supply voltages are reducing on current and newer technologies. Higher Vth MOS devices remain desirable for low off leakage and this is a current CMOS design challenge. Architectures/solutions compatible with lower leakage, higher Ron resistance are desirable in line with this wafer fabrication technology trend and these can be achieved in accordance with the present teaching.

It will be understood that where the reference terminals of one or more of the first or second string were described as being driven by voltage sources/buffers/followers or coupled to passive or active networks that these could be implemented as a sub-part of a high-level circuit and the present teaching is not intended to be limited to any one specific implementation.

Optimisation of the DAC can be achieved in a number of different ways; for example parasitic impedance can be integrated into the optimization and the switch circuit may include for example a series resistance element of the same type of resistor or resistance material as R1 and/or R2, parasitic impedances. Any further developments in terms of the controlled impedance switch design can be used here also.

It will be understood that where the elements or devices that are used to fabricate the individual strings of the DAC are described with reference to resistors having a resistance that these are specific examples of impedance elements each having an associated impedance. The present teaching is not to be construed as being limited to resistors and resistance and other examples of impedance elements may be used within the overall context of the present teaching.

It will be appreciated that the present teaching describes MOS switches for the operation of the exemplary circuits described. However it will be understood that the operation of the present teaching is not limited to MOS switches and can be employed using Junction Field Effect Transistors (JFET) switches, Metal Semiconductor FET (MESFET) or High Electron Mobility Transistors (HEMT) or any other switching scheme used in converters. Furthermore, it will be appreciated that MOS devices are not manufactured using metal-oxide-semiconductor construction in modern technologies but this is the conventional term used to described generically modern "CMOS processes" including those implemented using poly gate or non-oxide insulation layer.

Other embodiments are within the spirit and scope of the appended claims. For example, due to manufacturing variances and second order non-ideal conditions, the nominal values of R1, R2, and Ron may be adjusted to give optimum results. Monte Carlo analysis, other statistical analysis or analog design optimization tools and methodologies may be used to perform this optimization. Further, various technologies may be used for the switches, such as CMOS transmission gates, one MOS transistor type (e.g., NMOS or PMOS), either of the above with a single, or plurality of, series resistors on one or both sides of the switch. Still further, two parallel resistor strings may be used.

While the present teaching has been described heretofore with reference to specific examples of conventional binary numbering arrangements as these represent commonly favoured and widely used implementations. However the present teaching should not be construed as being limited to such implementations as the teaching has application in non-binary base arrangements or different numbering systems such as for example relative primes.

Within the context of the present teaching the overall DAC resolution is a combination of the individual contributions by each of the stages. In the context of providing a binary DAC resolution one or more of the individual stages may provide a non-binary contribution. The number of states provided by a DAC architecture in accordance with the present teaching can be equal to or greater than that actually required and this may prove useful in circuit optimisation.

Where the present teaching describes specific features or elements with reference to one particular figure, it will be appreciated that those features or elements could be used with other features or elements without departing from the spirit or scope of the claimed teaching.

The words "comprises/comprising" and the words "having/including" when used herein with reference to the present Specification are used to specify the presence of stated features, integers, steps or components but does not preclude the presence or addition of one or more other features, integers, steps, components or groups thereof.

The present teaching is not limited to the embodiments hereinbefore described but may be varied in both construction and detail.

The invention claimed is:

1. A multistring digital to analog converter, DAC, comprising:
   a first string with a plurality of impedance elements;
   a second string with a plurality of impedance elements;
   a first switching network adapted to couple a voltage produced across at least one of the impedance elements in the first string across the second string in response to a digital input signal, said digital signal comprising a digital bit stream, the impedance elements in the second string configured to produce voltages in response to current passing from the first string through the first switching network to the second string to produce a corresponding analog signal to said digital input signal to an output node,
   a second switching network comprising non-current carrying switches configured to provide at least one least significant bit, LSB, transition at the output node in response to a sensed change across the first switching network; and
   a control circuit coupled to a reference impedance, and configured to provide code dependent compensation for, or control of, variances in a response of switches within the DAC relative to the reference impedance.

2. The DAC of claim 1 comprising a third switching network coupling terminals of the second string directly to the output node.

3. The DAC of claim 1 wherein the first switching network is responsive to the most significant bits, MSBs, and the least significant bits, LSBs, of said digital input signal.

4. The DAC of claim 1 comprising a third string with a plurality of impedance elements coupled to a switching network, the DAC being configured, in response to a digital input signal provided at an input to the DAC, to effect a switching of individual ones of the impedance elements to produce a corresponding analog signal at an output node of the DAC.

5. The DAC of claim 1 wherein the second switching network is configured to provide the LSB transition at the output node separately to a voltage drop across the impedance elements in the second string.

6. The DAC of claim 1 wherein switches of the first switch network are shared with the second string.

7. The DAC of claim 6 wherein individual ones of the shared switches selectively couple impedance elements of the first string to the second string or provide at least one LSB transition directly at the output node.

8. The DAC of claim 1 wherein the second string is configured to provide a loading effect across the first switching network and at least one impedance element of the first string.

9. The DAC of claim 8 wherein the DAC is configured such that a switching, using the first switching network, of the loading effect provided by the second string defines first and second LSB transitions.

10. The DAC of claim 8 wherein the second string is configured to provide a loading effect on the first string, this loading effect being sensed and defining a first LSB transition at the output node.

11. The DAC of claim 10, wherein a switching of the loading effect provided by the second string is sensed to provide a first and second LSB transition at the output node.

12. The DAC of claim 1 wherein a single switch provides a switching for neighboring impedance elements in the first string so as to provide multiple LSB changes at the output dependent on which impedance element in the first string the switch is coupled to.

13. The DAC of claim 1 wherein the first switching network is configured to provide an unloaded static state generated when a current path between a Most Significant Bit (MSB) impedance element of said DAC, associated with said first string, and a Least Significant Bit (LSB) impedance element of said DAC, associated with said second string, is presented as a high impedance.

14. The DAC of claim 13 wherein the first switching network is responsive to the most significant bits (MSBs) and the least significant bits (LSBs) of said digital input signal.

15. The DAC of claim 14 wherein a node between neighboring impedance elements of the first string is coupled to said output.

16. The DAC of claim 13 wherein the first switching network is responsive to transitions between most significant bits (MSBs) of said digital input signal.

17. The DAC of claim 15 wherein the switches of the switching network associated with said first string are sized such that the two states on either side of the unloaded state correspond to substantially one LSB steps at the output node.

18. The DAC of claim 13 wherein switches associated with said first string couple a node from the first string directly to said output node.

19. The DAC of claim 13 wherein a switch associated with said first string is connected in series with a switch of said second string to couple a load node of said first string to said output node.

20. The DAC of claim 1 configured to provide four LSB state transitions at the output node, a first state provided by the voltage at an output of the first switching network, a second state provided by the voltage on an input side of the first switching network before a LSB transition provided by the first switching network and second string, a third state provided on an input side of the first switching network after a LSB transition provided by the second string and a fourth state provided on an output of the second switching network.

21. The DAC of claim 20 configured to provide a high impedance at a terminal of the second string such that a fifth LSB state transition may be provided at the output node by sensing the voltage at an input side of the first switching network during this high impedance configuration.

22. The DAC of claim 20 wherein the first switching network has an on switch resistance $R_{ON}$, the first string comprises impedance elements having a resistance R1 and the second string comprises impedance elements having a resistance R2, and wherein $R_{ON}$, R2 and R1 are substantially equal.

23. The DAC of claim 1 configured such that to provide N2 states the second string comprises N2-3 impedance elements.

24. The DAC of claim 1 comprising reference terminals and wherein current through the reference terminals is substantially code independent.

25. The DAC of claim 1 configured such that to provide N2 states the second string comprises N2-4 impedance elements.

26. The DAC of claim 25 comprising a source impedance element in series between the first string and a reference terminal, the source impedance element being switchable to provide an LSB transition at the output of the DAC.

27. The DAC of claim 25 comprises a switch configured to switchably couple a reference terminal to the DAC output to provide an LSB transition at the DAC output.

28. The DAC of claim 27 wherein a switching of the source impedance element to the first string provides an extra code in the DAC transfer function.

29. The DAC of claim 25 wherein the first switching network has an on switch resistance $R_{ON}$, the first string comprises impedance elements having a resistance R1 and the second string comprises impedance elements having a resistance R2 and wherein $$R2 = \frac{1}{k} * \frac{2^{n2}-k}{2^{n2}-2} * R1$$

where k=LSB loading effect target with range $0<k<2^{n2}$ and n2 is equal to the resolution of the second string.

30. The DAC of claim 29 wherein R2<R1 or wherein R2 is substantially equal to R1.

31. The DAC of claim 30 wherein Ron and R2 are substantially equal.

32. The DAC of claim 31 the values of R2 and R1 are selected such that at a mid-point of the first string the non-linearity of DAC transfer function is substantially negligible.

33. The DAC of claim 32 wherein the values of R2 and R1 are selected such that 2*R2=R1.

34. The DAC of claim 30 wherein reference terminals of the first string are coupled to a voltage source.

35. The DAC of claim 30 wherein the first string is coupled to a voltage source at reference terminals of the first string and a source impedance is provided at least one of the reference terminals.

36. The DAC of claim 35 wherein the source impedance at least one of the reference terminals reduces or scales an error of the DAC transfer function.

37. The DAC of claim 35 wherein the source impedance is scaled relative to a DAC string impedance.

38. A method of converting a digital input signal to a corresponding analog output, the method comprising:
    Providing a digital bit stream to a digital to analog converter, DAC, the DAC comprising a first string with a plurality of impedance elements, a second string with a plurality of impedance elements and a first switching network;
    Providing a second switching network comprising non-current carrying switches;
    In response to the digital bit stream using the impedance elements in the second string to produce voltages in response to current passing from the first string through the first switching network to the second string to produce a corresponding analog signal to said digital input signal to an output node and using the second switching network to provide at least one least significant bit, LSB, transition at the output node in response to a sensed change across the first switching network; and
    providing code dependent compensation for, or control of, variances in a response of switches within the DAC relative to a reference impedance.

39. The method of claim 38 comprising providing at least one LSB transition directly at the output node by decoupling the second string from the first string.

* * * * *